(12) United States Patent
Kim

(10) Patent No.: US 11,138,039 B2
(45) Date of Patent: Oct. 5, 2021

(54) MEMORY SYSTEM FOR REMOVING MEMORY CELL FAULT AND METHOD THEREOF

(71) Applicant: SK hynix Inc., Gyeonggi-do (KR)

(72) Inventor: Woong-Rae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 253 days.

(21) Appl. No.: 16/038,732

(22) Filed: Jul. 18, 2018

(65) Prior Publication Data

US 2019/0163532 A1 May 30, 2019

(30) Foreign Application Priority Data

Nov. 29, 2017 (KR) .................. 10-2017-0161957

(51) Int. Cl.
| | |
|---|---|
| *G06F 9/38* | (2018.01) |
| *G06F 9/50* | (2006.01) |
| *G11C 7/10* | (2006.01) |
| *G11C 29/52* | (2006.01) |
| *G11C 29/42* | (2006.01) |
| *G11C 29/16* | (2006.01) |
| *G11C 29/04* | (2006.01) |

(52) U.S. Cl.
CPC .......... *G06F 9/5016* (2013.01); *G06F 9/3834* (2013.01); *G06F 9/5061* (2013.01); *G11C 7/1006* (2013.01); *G11C 7/1057* (2013.01); *G11C 29/16* (2013.01); *G11C 29/42* (2013.01); *G11C 29/52* (2013.01); *G11C 2029/0409* (2013.01); *G11C 2029/0411* (2013.01)

(58) Field of Classification Search
CPC .... G06F 9/5016; G06F 9/5061; G06F 9/3834; G11C 29/16; G11C 29/42; G11C 29/52; G11C 9/5061; G11C 7/1006; G11C 7/1057; G11C 2029/0411; G11C 2029/0409
See application file for complete search history.

(56) References Cited

U.S. PATENT DOCUMENTS

| | | | |
|---|---|---|---|
| 8,046,559 B2 | 10/2011 | Zheng et al. | |
| 8,463,987 B2 | 6/2013 | Abraham et al. | |
| 9,710,329 B2* | 7/2017 | Golan | .................. G11C 29/44 |
| 2002/0004921 A1* | 1/2002 | Muranaka | ........... G06F 11/1008 |
| | | | 714/704 |
| 2011/0107161 A1* | 5/2011 | Eguchi | .................. G11C 29/42 |
| | | | 714/721 |
| 2016/0034206 A1* | 2/2016 | Ryan | .................. G11C 16/349 |
| | | | 711/103 |
| 2018/0108422 A1* | 4/2018 | Oh | ........................ G11C 16/26 |
| 2019/0095299 A1* | 3/2019 | Liu | .................... G06F 11/2257 |
| 2019/0172542 A1* | 6/2019 | Miladinovic | .......... G11C 29/44 |

* cited by examiner

*Primary Examiner* — Charles Rones
*Assistant Examiner* — Tong B. Vo
(74) *Attorney, Agent, or Firm* — IP & T Group LLP

(57) ABSTRACT

A memory system includes: a memory device that includes a plurality of ranks; and a memory controller suitable for deciding selection signals each of which selects one command set corresponding to each of combinations of the ranks and at least one program executed in the memory device among a plurality of command sets, and executing a program including the selected command set in the memory device.

19 Claims, 15 Drawing Sheets

MEMORY SYSTEM FOR REMOVING MEMORY CELL FAULT AND METHOD THEREOF

CROSS-REFERENCE TO RELATED APPLICATIONS

This application claims priority of Korean Patent Application No. 10-2017-0161957, filed on Nov. 29, 2017, which is incorporated herein by reference in its entirety.

BACKGROUND

1. Field

Exemplary embodiments of the present invention disclosure relate to a memory system and a method for operating the memory system.

2. Description of the Related Art

Generally, memories are fully tested in the stage of fabrication before they are put into the market. However, in a practical usage environment, additional faults may occur or be detected, in the memories. The additional faults may be categorized into two types: intermittent faults that occur intermittently according to an operational or environmental factors of a memory cell, and aging faults that may not be recovered into a normal (no-fault) state because they originate from a physical factor of a memory cell.

SUMMARY

Embodiments of the present invention disclosure are directed to a memory system capable of curing faults occurring in memory cells, and a method for operating the memory system.

Embodiments of the disclosure are directed to a memory system that may schedule or customize a command set to reduce or minimize intermittent faults that may occur in memory cells, and a method for operating the memory system.

In accordance with an embodiment of the disclosure, a memory system includes: a memory device that includes a plurality of ranks; and a memory controller suitable for deciding selection signals each signal selecting one command set corresponding to a combination of the ranks and at least one program executed in the memory device among a plurality of command sets, and executing a program including the selected command set in the memory device.

In accordance with another embodiment of the disclosure, a method for operating a memory controller for controlling an operation of a memory device including a plurality of ranks includes: performing an Error Correction Code (ECC) operation onto a data stored in, or outputted from, at least one rank of the memory device; deciding selection signals each of which selects one command set corresponding to each of combinations of the ranks and at least one program executed in the memory device among a plurality of command sets; and executing a program including the selected command set in the memory device executing a program including the selected command set in the memory device to cure an ECC uncorrectable error while the ECC operation is performed.

DETAILED DESCRIPTION

Figure 1A:
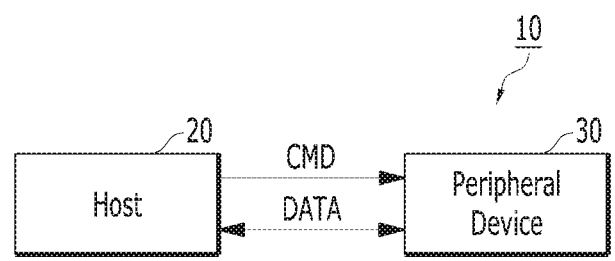
FIGS. 1A and 1B are block diagrams illustrating a data processing system.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Moreover, it is noted that the terminology used herein is for describing the examples only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features.

Also, as used herein, the term "and/or" includes any and all combinations of one or more of the associated listed items.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1B:
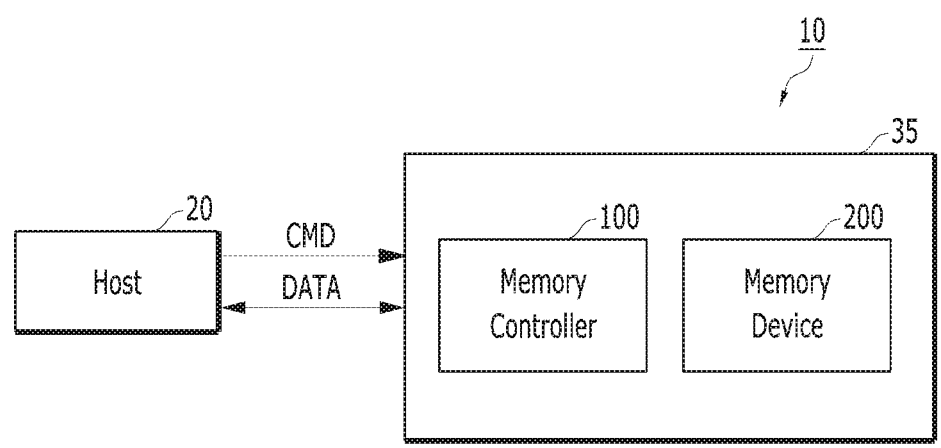

FIGS. 1A and 1B are block diagrams illustrating a data processing system 10.

Referring to FIG. 1A, the data processing system 10 may include a host 20 and a peripheral device 30. The peripheral device 30 may receive a command CMD (or a request) from the host 20. The peripheral device 30 may transfer and receive a data DATA according to the received command. By the way of example but not limitation, the host 20 may be a computer, a server, a smart phone and the like, while the peripheral device 30 may be a mobile or storage product.

Referring to FIG. 1B, the peripheral device 30 shown in FIG. 1A may be implemented with a memory system 35. The data processing system 10 may include a host 20 and memory system 35. The host 20 may include portable electronic devices such as mobile phones, MP3 players, laptop computers and the like, or electronic devices such as desktop computers, game players, televisions (TVs), projectors and the like.

The memory system 35 may be accessed in response to a command entered from the host 20. The memory system 35 may be used as a main memory unit or an auxiliary memory unit of the host 20.

The memory system 35 may include a memory controller 100 and a memory device 200. The memory controller 100 may perform an access operation to the corresponding memory device 200 in response to a command from the host 20. By the way of example but not limitation, the memory controller 100 may store a write data from the host 20 in the memory device 200 in response to a write command from the host 20. In another example, the memory controller 100 may read a data stored in the memory device 200 in response to a read command from the host 20. The memory controller 100 may transfer the read data to the host 20. According to diverse embodiments of the present invention, the memory device 200 may be a volatile memory device such as a Dynamic Random-Access Memory (DRAM), a Static Random-Access Memory (SRAM) and the like. According to other embodiments of the present invention, the memory device 200 may be a non-volatile memory device, such as a Read Only Memory (ROM), a Mask ROM (MROM), a Programmable ROM (PROM), an Erasable ROM (EPROM), an Electrically Erasable ROM (EEPROM), a Ferromagnetic Random Access Memory (FRAM), a Phase-change RAM (PRAM), a Magnetic RAM (MRAM), a Resistive RAM (RRAM), a flash memory and the like.

In a system including at least one memory device, faults in the memory devices may occur for different reasons. The faults that may occur additionally (also referred to as additional defects hereinafter) may be categorized into intermittent faults and aging faults. The aging faults, such as Bias Temperature Instability (BTI) and a gate-oxide breakdown, may be considered defects that may be hardly recovered permanently as time passes. On the other hand, the intermittent faults may be defects that may occur due to variations in temperature, environment, process and test bench characteristics. When an intermittent fault occurs, the memory cell including the intermittent fault may operate normally again after it is cured.

An error correction technology using a so-called Error Correction Code (ECC) may be used to solve the problem of the additional faults. However, as memory capacity increases and memories are used in a variety of environments such as the Internet of Things (IoT)/automotive, the additional faults are more likely to occur, resulting in ECC uncorrectable situations where faults are not corrected with an error correction code.

Figure 2:
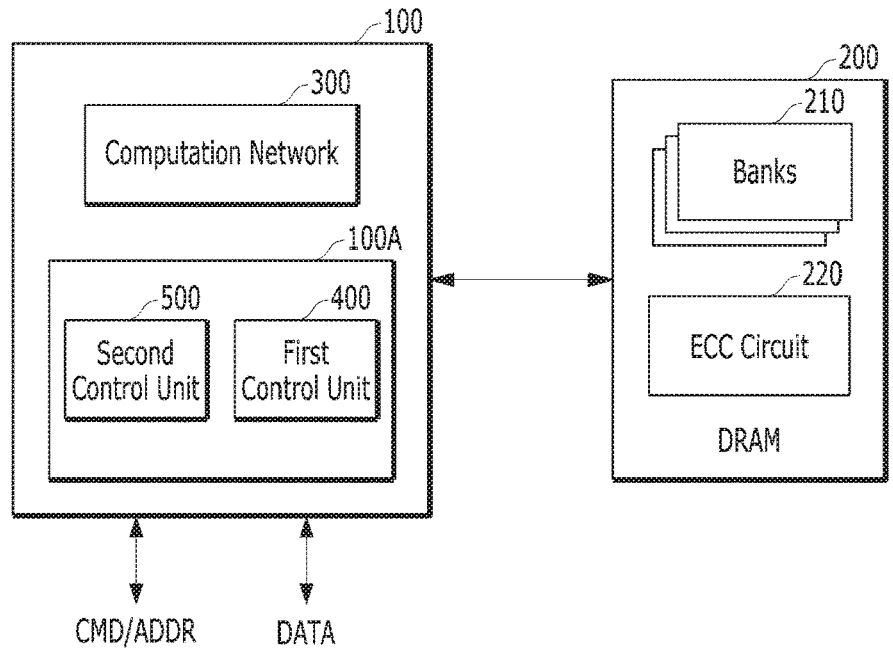
FIG. 2 is a block diagram illustrating a memory system in accordance with an embodiment of the present invention.

FIG. 2 is a block diagram illustrating a memory system in accordance with an embodiment of the present invention.

Referring to FIG. 2, the memory system may include a memory controller 100 and a memory device 200. The memory controller 100 may control the memory device 200 in response to an access request that is received from an external device, e.g., the host 20 of FIGS. 1A and 1B. The received request may include a single command, such as a read command or a write command, delivered into the memory device 200. In a variation of the described embodiment, the received request may include a combination of a plurality of memory commands, i.e., a command set, as a function for performing a specific function. Hereafter, the term "program" may include a command set, i.e., a combination of a plurality of memory commands.

By the way of example but not limitation, the program may include a wide range of a function or an application, such as surfing the Internet, playing a game, etc., that may be performed in the data processing system using the memory system 35 as illustrated in FIGS. 1A and 1B. For another example, the program may refer to a range of a function or an application, such as a background screen, a clock, etc., that may be performed in the data processing system. In another example, the program may include a random function or an incremental function for a narrow range of a function or an application that may be performed in the data processing system.

When the memory device 200 is a Dynamic Random-Access Memory (DRAM), a program may be constituted with a combination of an active command ACT, a read command RD, and a write command WR. By the way of example but not limitation, the program may include a set of commands, i.e., a command set, in the order of ACT→RD→WR→ACT→RD→WR. For another example, a program may be a set of commands in the order of ACT→RD→ACT→WR→ACT→RD→ACT→WR. In another example, the program may include a set of commands in the order of ACT→RD→WR→RD→WR.

The memory device 200 may operate in response to an access request from the memory controller 100. For example, in response to a write command from the memory controller 100, the memory device 200 may store data delivered from the memory controller 100 in its corresponding storage area. For another example, the memory device 200 may read a data stored in a storage area, corresponding to a read command, and transfer the read data to the memory controller 100 in response to the read command from the memory controller 100.

According to embodiments of the disclosure, the memory device 200 may be a Dynamic Random-Access Memory (DRAM). In this case, the memory device 200 may include a plurality of memory banks 210 as a memory storage area.

Each of the memory banks 210 may be formed of a memory cell array including a plurality of memory cells that are coupled between word lines and bit lines. One memory bank may include one memory chip including a plurality of memory cells. One memory rank may include a plurality of memory banks or a plurality of memory chips. By the way of example but not limitation, a rank of 8-bit wide DRAMs may include 8 memory chips, while a rank of 4-bit wide DRAMs may include 16 memory chips.

Also, the memory device 200 may perform an operation of correcting an error occurring while an operation is performed in response to an access request of the memory controller 100. The memory device 200 may include an error correction code (ECC) circuit 220. By the way of example but not limitation, the ECC circuit 220 may perform an error correction operation onto either a data to be written in a specific cell of the memory banks 210 or a data to be read from a specific cell of the memory banks 210.

The memory controller 100 may include a control unit 100A and a computation network 300. The control unit 100A may perform an operation corresponding to an access request from the outside (e.g., the host 20 of FIGS. 1A and 1B). By the way of example but not limitation, the control unit 100A may receive a command CMD and an address ADDR entered from the host 20. The control unit 100A may deliver a write data DATA corresponding to the received command and address into the memory device 200. The control unit 100A may receive a read data DATA corresponding to the received command and address from the memory device 200. The control unit 100A may include a first control unit 400 and a second control unit 500. Herein, a case where the control unit 100A is divided into two units or circuits is explained for the sake of convenience, but it should be noted that the concept and spirit of the present invention are not limited to the case alone. The structure and operation of each of the first control unit 400 and the second control unit 500 will be described later.

The memory controller 100 may include a computation network 300. The computation network 300 may be realized by using a neural network structure. The neural network structure is a structure that may be used for an artificial intelligence, machine learning, a neuromorphic processor, etc. The neural network structure may enable a large amount of data to be processed in parallel. Also, the computation network 300 may predict a command set customized according to the execution of a program for the memory device 200 by using a parallel processing technique that continuously accumulates and utilizes existing data. The memory controller 100, which may be implemented in this structure, may enhance or optimize system reliability and system performance by predicting the optimal command set that minimizes the CPU performance penalty.

ECC uncorrectable errors occurring in the actual usage environment of the memory device 200, which is described above, may occur differently according to the order and combination of command sets for the program to be performed onto the memory device 200. Thus, the scheduling for the memory device, for example, an ECC failure rate, may vary according to the combination of command sets processed by a unit memory rank, when the memory device 200 is a DRAM. A row hammer phenomenon may be highly dependent on a sequential order of the command sets and/or how to combine the command sets. Herein, the low hammer signifies a phenomenon that the data of an arbitrary memory cell is deteriorated within a shorter time than a refresh interval, as the amount of charges of the arbitrary memory cell included in the memory device 200 is affected by the active-precharge of a word line which is disposed adjacent to a word line to which the memory cell is connected.

When the memory scheduling is changed to lower the ECC failure rate, the performance of the entire memory system may be degraded or the usage of the area of a specific memory device (e.g. a DRAM rank) may be reduced. By the way of example but not limitation, when the order and combination of command sets for a program to be performed onto the memory device 200, which may be implemented in a DRAM, is changed, the total throughput of the command sets processed by all DRAM ranks within a unit time may be reduced. Also, when usage of DRAM ranks is not uniform, i.e., when usage of some ranks is low while usage of other ranks is high, the life span of the memory system may be reduced due to aging. In other words, when memory scheduling is changed to minimize ECC uncorrectable errors, the performance of the system may be degraded and the lifetime of the system may be reduced. Various embodiments of the present invention disclosure provide a memory scheduling method that minimizes ECC uncorrectable errors while at the same time minimizing system performance and life span degradation.

Although the ECC correction rate may increase as time passes due to memory aging, memory aging is not related to the combination and/or order of the command sets. Therefore, there is no need to change a command set if the ECC correction rate increases according to the aging issue. In this regard, embodiments of the present invention disclosure analyze the tendency of ECC correction information to determine the extent of aging in a corresponding memory rank. When aging faults are dominant over intermittent faults, the command set is not changed, thereby preventing degradation of the system performance resulting from a change in the command set.

Although the following embodiments of the disclosure are described by exemplarily taking a case where the memory device is formed of a DRAM, the spirit and concept of the present invention are not limited to the case. The ECC uncorrectable fault rate, which additionally occurs in an actual usage environment of the memory device such as a DRAM, may be dependent on a process variation of the DRAM, a diagnosis result of whether an ECC uncorrectable fault is an aging or an intermittent fault, and the kind of a command set (or a program). Various embodiments of the present invention provide a parallel operation memory scheduling technique of the memory controller that maximizes system performance and life span while minimizing ECC uncorrectable fault occurrence rate by using DRAM on-die ECC information. The memory controller 100 according to embodiments, for example, the memory controller 100 shown in FIG. 2, may have the following characteristics.

First, since intermittent faults vary according to process variation, environment/temperature or program (or command set), the memory controller 100 may perform a memory scheduling operation that minimizes intermittent faults by storing and learning corresponding information (e.g., ECC correction information/failure tendency information) for each rank and/or each program, which are considered a unit whose process variation is similar.

Secondly, the memory controller 100 may perform a memory scheduling operation that maximizes the life span of the system and maximizes command set throughput per unit time, which is the performance of the entire system, by minimizing the intermittent faults rate of the DRAM and at the same time, learning the performance related information of the entire system and the performance related information of each of the ranks accumulated in an internal register to maximize the uniformity of the frequency of using the ranks of the DRAM.

Thirdly, the memory controller 100 may distinguish whether the DRAM fault is an aging or an intermittent fault through trend learning on the ECC correction related information. The memory controller 100 may perform a memory scheduling operation for controlling the intermittent fault with the minimal memory performance penalty.

Fourthly, the memory controller 100 may reduce or minimize the operation processing time and increase or maximize the accuracy of the predicted data by utilizing the parallel operation processing method, which is frequently used in machine learning.

Figure 3:
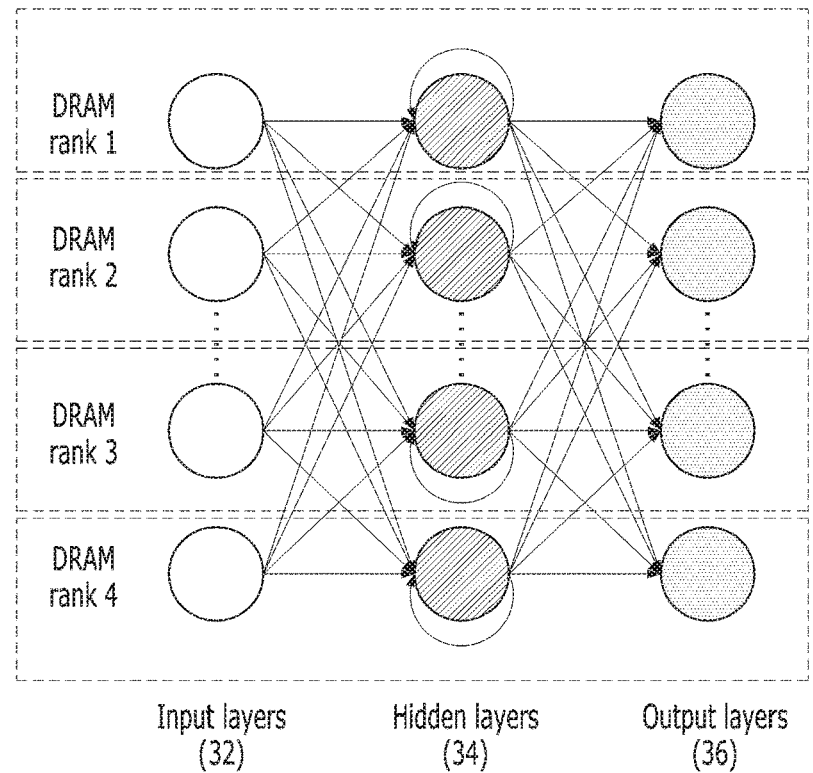
FIG. 3 illustrates a neural network structure that may be realized in a computation network in accordance with an embodiment of the present invention.

FIG. 3 illustrates a neural network structure realized in a computation network 300 in accordance with an embodiment of the present invention. The neural network may be a so-called recurrent Neural Network (RNN) structure.

The RNN structure may include input layers 32, hidden layers 34, and output layers 36. Each layer may include a memory and a computer. The input layers 32 and the hidden layers 34 may collect and compute data, while the output layers 36 may compute desired parameter values. This RNN structure is advantageous in that a large amount of data is processed in parallel, and at the same time, power consumption is low for performing a large amount of computation, and that output layers may be able to predict optimal data by learning the data that are previously stored in the hidden layers.

The memory controller 100 of FIG. 2, which is realized to have an RNN structure, may include computation units (see FIG. 6) corresponding to combinations of a plurality of ranks and a plurality of programs, respectively, to express a process variation for each rank. Each of the computation units may learn the related accumulated data so that the optimal memory scheduling operation is performed. For example, if one memory system supports eight DRAM ranks and 10 programs, a memory scheduling operation may be performed quickly because each of a total of 80 computation units performs an individual operation in parallel concurrently.

In FIG. 3, each of the y-axis (or vertical axis) layers is a layer for computing information of an independent memory rank. For example, the first upper layer on the y-axis may compute information on a DRAM rank 1. The second upper layer on the y-axis may compute information on the DRAM rank 1. The third upper layer on the y-axis may compute information on a DRAM rank 3. The fourth upper layer on the y-axis may compute information on a DRAM rank 4. This structure may represent process variation of different memory ranks.

Each of the hidden layers 34 on the x-axis (or the horizontal axis) may represent different kinds of programs (or kinds of command sets, drive time units), and temperature/environment. In other words, one vertical-axis layer unit may represent different kinds of program sets. In short, the number of the hidden layers 34 may correspond to the number of the kinds of programs in need of collecting information.

The input layers 32 and the output layers 36 may be constituent elements corresponding to the second control unit 500 which will be described later in FIG. 7. The hidden layers 34 may be constituent elements corresponding to the unit computation units 300A shown in FIG. 6.

Figure 4:
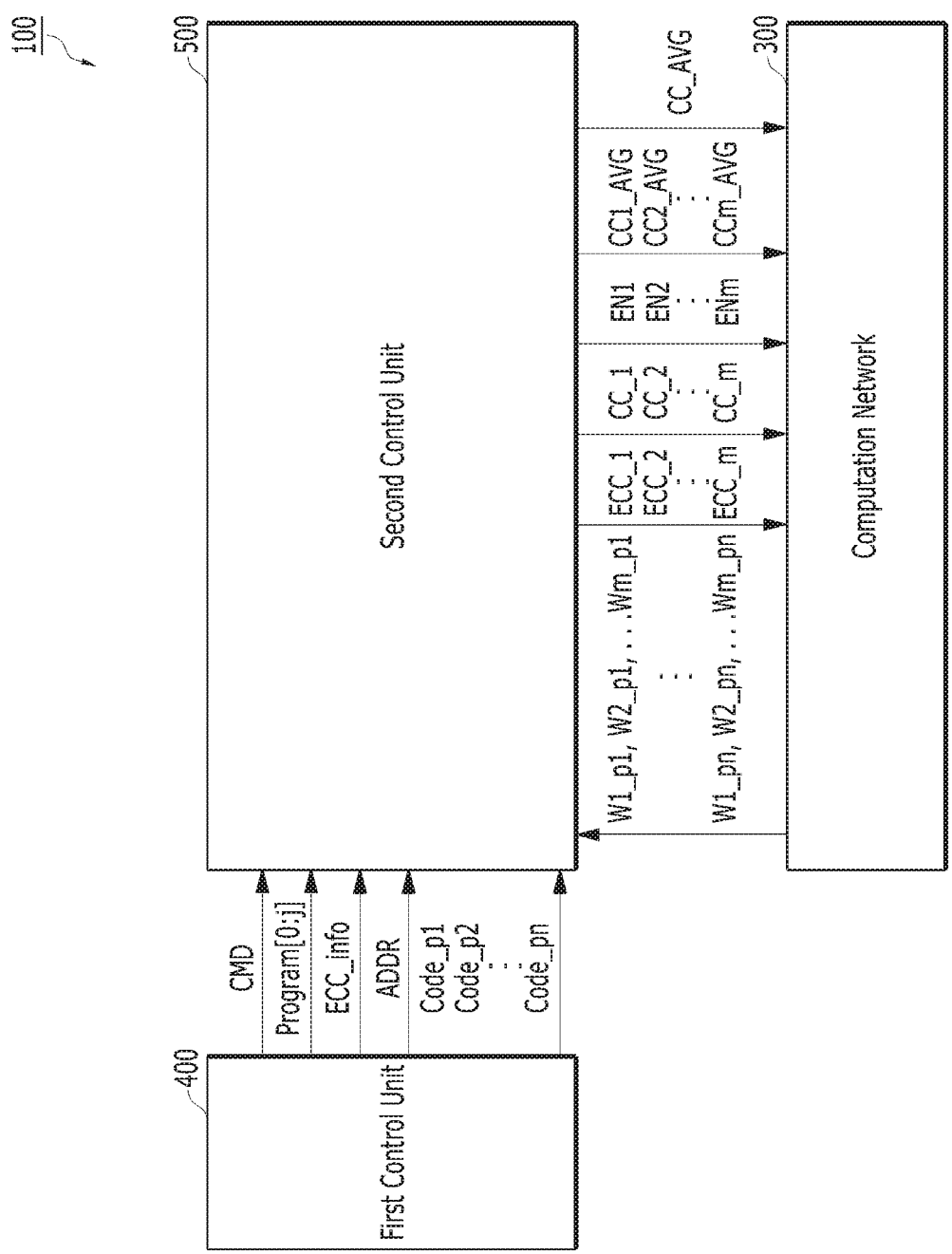
FIG. 4 is a block diagram illustrating a memory controller in accordance with an embodiment of the present invention.

FIG. 4 is a block diagram illustrating the memory controller 100 in accordance with an embodiment of the disclosure.

Referring to FIG. 4, the memory controller 100 may include a computation network 300, a first control unit 400, and a second control unit 500. The first control unit 400 may transfer a command CMD, a program information Program [0:j], address information ADDR, and error correction information ECC-info. to the second control unit 500. For example, the first control unit 400 may receive the command CMD, the program information Program[0:j], and the address information ADDR from the host 20 shown in FIG. 1B and transfer them to the second control unit 500. Also, it may receive the error correction information ECC-info from the memory device 200 shown in FIG. 2 and may transfer it to the second control unit 500.

The second control unit 500 may generate various information (or signals or values) ECC_1 to ECC_m, CC_1 to CC_m, EN1 to ENm, CC1_AVG to CCm_AVG, CC_AVG in response to the information entered from the first control unit 400. The second control unit 500 may provide the computation network 300 with the generated information.

The computation network 300 may perform operations for selecting an optimal command set for each of the combinations of the memory ranks and programs. For this operation, the computation network 300 may receive various information ECC_1 to ECC_m, CC_1 to CC_m, EN1 to ENm, CC1_AVG to CCm_AVG, CC_AVG from the second control unit 500. Also, the computation network 300 may output the information W1_p1, W2_p2, . . . Wm_p1, . . . W1_pn, W2_pn, . . . , Wm_pn according to the result of the operation to the second control unit 500.

The second control unit 500 may receive information W1_p1, W2_p2, . . . Wm_p1, . . . W1_pn, W2_pn, . . . , Wm_pn from the computation network 300, generate the information Code_p1, Code_p2, . . . , Code_pn corresponding to the received information, and output them to the first control unit 400.

The first control unit 400 may receive the information Code_p1, Code_p2, . . . , Code_pn from the second control unit 500. The first control unit 400 may select the optimal command set for each program in response to the received information and control a program operation corresponding to the selected command set for the memory device 200 to be performed. Herein, the Code_p1 is a signal for selecting an optimal command set among the command sets for a first program p1, and the Code_p2 is a signal for selecting an optimum command set among the command sets for a second program p2. The Code_pn is a signal for selecting an optimal command set among the command sets for an $n^{th}$ program pn.

The first control unit 400 may be included in a general memory controller. The second control unit 500 is linked with the computation network 300. In a variation of the described embodiment, the first control unit 400 and the second control unit 500 may form a single control unit.

Key symbols and their meanings employed herein are included in TABLE 1 below.

TABLE 1

| No | Key symbols | Definition |
|---|---|---|
| 1 | ADDR | Address |
| 2 | CC_1, CC_2, . . . CC_m | Total number of commands executed for each of m ranks |
| 3 | CC_AVG | The average of all the numbers of command sets processed while m ranks execute n programs |
| 4 | CC1_AVG, CC2_AVG, . . . CCm_AVG | The average number of command sets when each rank executes n programs |

TABLE 1-continued

| No | Key symbols | Definition |
|---|---|---|
| 5 | Code_p1, Code_p2, . . . Code_pn | Command set selection code for each program |
| 6 | CMD | Command |
| 7 | ECC_info | ECC information or correction information |
| 8 | ECC_1, ECC_2, . . . ECC_m | Number of ECC-corrected memory cells for each of m ranks |
| 9 | ECC_ref1 | Counted number of ECC maximally allowed for rank 1 in a particular program |
| 10 | EN1, EN2, . . . Enn | Enable signal for selecting n programs |
| 11 | Program[0:j] | Program information |
| 12 | Ref_N1, Ref_N2 | Reference value |
| 13 | W1_p1, . . . Wm_pn | Signal or code for selecting a command set for m ranks and n programs |

Figure 5:
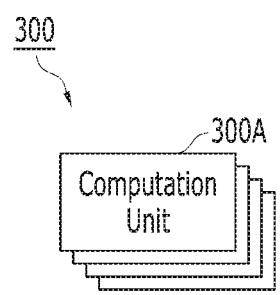
FIG. 5 illustrates a computation network in accordance with the embodiment of the present invention.

FIG. 5 is a block diagram illustrating the computation network 300 in accordance with an embodiment of the present invention.

Referring to FIG. 5, the computation network 300 may include a plurality of computation units 300A. Each of the computation units 300A may include (m×p) computation units according to the combination of m memory banks and p programs.

Figure 6:
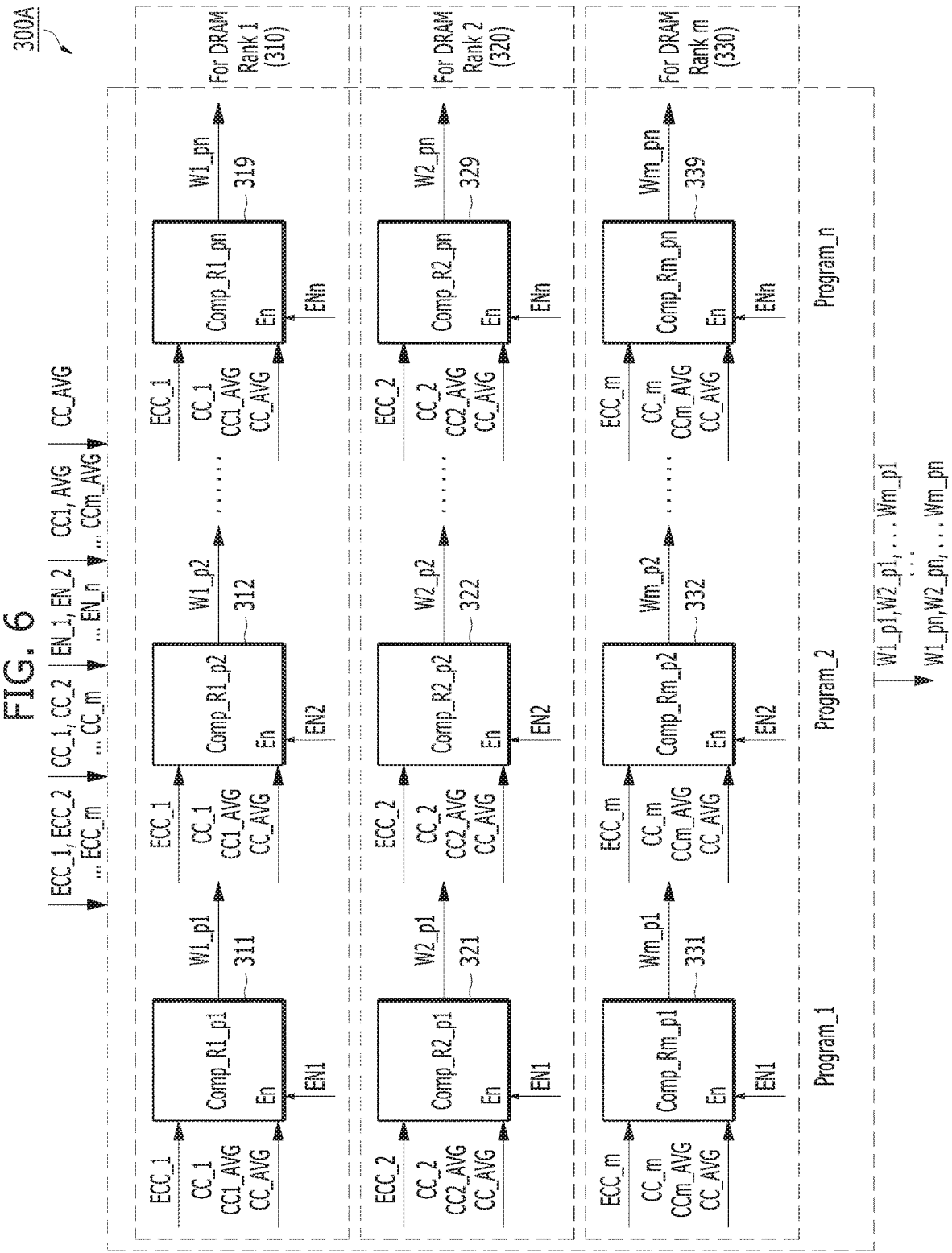
FIG. 6 is a block diagram illustrating computation units in accordance with the embodiment of the present invention.

FIG. 6 is a block diagram illustrating the computation units 300A in accordance with the embodiment of the present invention.

Referring to FIG. 6, the computation units 300A may include (m×p) computation units corresponding to combinations of m memory ranks and n programs. The computation units 300A may receive the values ECC_1 to ECC_m, CC_1 to CC_m, EN1 to ENm, CC1_AVG to CCm_AVG, CC_AVG from the second control block 500 shown in FIG. 5 to perform the corresponding computation operation. Also, the computation units 300A may output the values W1_$p$1, W2_$p$1, . . . Wm_p1, . . . W1_$pn$, W2_$pn$, . . . Wm_pn to the second control block 500 according to the result of the computation operation.

Computation units 311 to 319 are computation units for a first DRAM rank 310. Computation units 321 to 329 are computation units for a second DRAM rank 320. Computation units 331 to 339 are computation units for a m$^{th}$ DRAM rank 330. The computation units 311, 321, 331 are computation units for a first program Program_1. The computation units 312, 322, 332 are computation units for a second program Program_2. The computation units 319, 329 and 339 are computation units for an nt$^h$ program Program_n.

The computation unit 311 may receive the values EN1, ECC_1, CC_1, CC1_AVG, CC_AVG, perform a computation operation in response to the received values, and output W1_$p$1. The other computation units 312 and 319 for the first DRAM rank 310 may perform similar computation operations. The computation unit 211 may receive the values EN1, ECC_2, CC_2, CC2_AVG, CC_AVG, perform a computation operation in response to the received values, and output W2_$p$1. The other computation units 322, 329 for the second DRAM rank 320 may perform similar computation operations. The computation unit 331 may receive the values EN1, ECC_m, CC_m, CCm_AVG, CC_AVG, perform a computation operation in response to the received values to output Wm_p1. The other computation units 332, 339 for the m$^{th}$ DRAM rank 330 may perform similar computation operations.

Referring back to FIGS. 2, 4, 5 and 6, the computation network 300 may include the computation units 300A for performing a unit computation. There are layers from the DRAM rank 1 Comp_R1_$p$1 to Comp_R1_$pn$ to the DRAM rank m Comp_Rm_p1 to Comp_Rm_pn on the horizontal axis of each computation unit 300A. The vertical axes of the computation units 300A may be divided according to the kind of programs. The number of the programs may be freely set by a user. The group of computation units Comp_R1_$p$1, Comp_R2_$p$1, . . . Comp_Rm_p1 on the first vertical axis may include the ranks performed in a unit program 1. There are n groups of computation units, which may store information corresponding to n programs.

A total of m×n computation units 300A included in the computation network 300 may cumulatively store and learn the respective data and predict a command selection code signal or codes W1_$p$1 to Wm_pn. Reasons for dividing the computation units into several groups include:

1) Since the rate of DRAM intermittent faults is a function dependent on the combination of command sets, it is necessary to separately calculate a failure rate tendency for each of n programs including a combination of command sets. Therefore, the computation network 300 may be designed to include an independent computation unit for each program.

2) DRAM intermittent faults may be affected by process variation of a DRAM die. Each rank may have a similar process variation, and a specific rank may represent a process variation that is different from the other ranks. Therefore, to express the process variation, the computation network 300 may be designed to include different computation units for each of the m ranks.

By designing the m×n computation units, it is possible to express both the process variation dependency and the dependency of the command set combination of the rate of the intermittent faults of the DRAM 3) Each of the computation units 300A included in the computation network 300 may have a parallel structure of simultaneously processing a series of corresponding processes of storing data of different cases, learning them, and predicting a final command set.

Therefore, the computation network 300 may achieve the minimum computation time. That is, the memory controller 100 may reduce the computation time.

Figure 7:
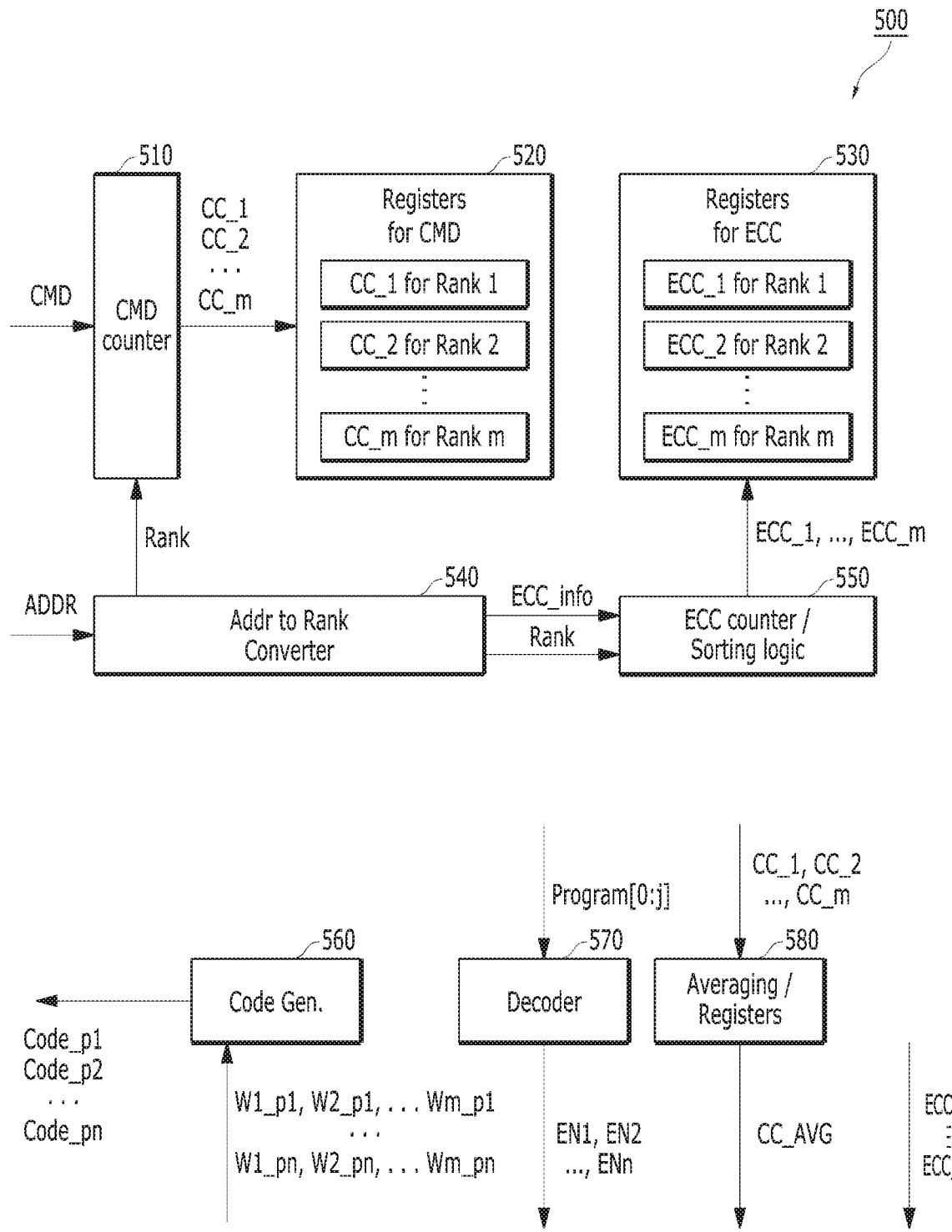
FIG. 7 is a block diagram illustrating a second control unit in accordance with an embodiment of the present invention.

FIG. 7 is a block diagram illustrating the second control unit 500 in accordance with an embodiment of the present invention.

Referring to FIG. 7, the control block 500 may include a command counter 510, registers 520, registers 530, an address-to-rank converter 540, and an ECC counter and sorting logic 550.

The command counter 510 may perform a count operation by inputting the command CMD and the rank signal Rank, and output information CC_1, CC_2, . . . , CC_m on the number of commands executed for each rank. The registers 520 may include registers for storing the count result obtained by the command counter 510. For example, the registers 520 may include a register for storing the number of commands CC_1 executed for a rank 1, a register for storing the number of commands CC_2 executed for a rank 2, and a register for storing the number of commands CC_m executed for an m$^{th}$ rank.

The address-to-rank converter 540 may convert the received address ADDR into a corresponding rank signal Rank and outputs the rank signal Rank. By the way of example but not limitation, when the address ADDR of the memory device 200 is entered, the address-to-rank converter 540 may detect the corresponding rank of the corresponding memory device 200 and output a value indicating the detected rank. The ECC counter and sorting logic 550 may perform a count operation and a sorting operation by inputting the error correction information ECC_info and the rank signal Rank, and output the information ECC_1, ECC_2, . . . , ECC_m on the number of ECC corrections for each rank. The registers 530 may include registers for storing the count result obtained by the ECC counter 540. For example, the registers 530 may include a register for storing the number of ECC corrections ECC_1 for the rank 1, a register for storing the number of ECC corrections ECC_2 for the rank 2, and a register for storing the number of ECC corrections ECC_m for the $m^{th}$ rank.

Also, the control block 500 may include a code generator 560, a decoder 570, and an averaging logic and registers 580. The decoder 570 may receive and decode the program information Program[0:j] and output signals EN1, EN2, . . . ENn for enabling a particular program. The averaging logic and registers 580 may receive information CC_1, CC_2, . . . , CC_m on the number of commands executed for each rank, take an average value of them, and output an average value CC_AVG. Herein, the internal registers included in the averaging logic and registers 580 may store information CC_1, CC_2, . . . , CC_m on the number of commands executed by each rank, and store an average value CC_AVG.

The code generator 560 may receive the computation result values W1_p1, W2_p1, . . . , Wm_p1, . . . , W1_pn, W2_pn, . . . , Wm_pn, obtained by the computation units 300A, and generate and output the information Code_p1, Code_p2, . . . , Code_pn corresponding to the received values.

Figure 8:
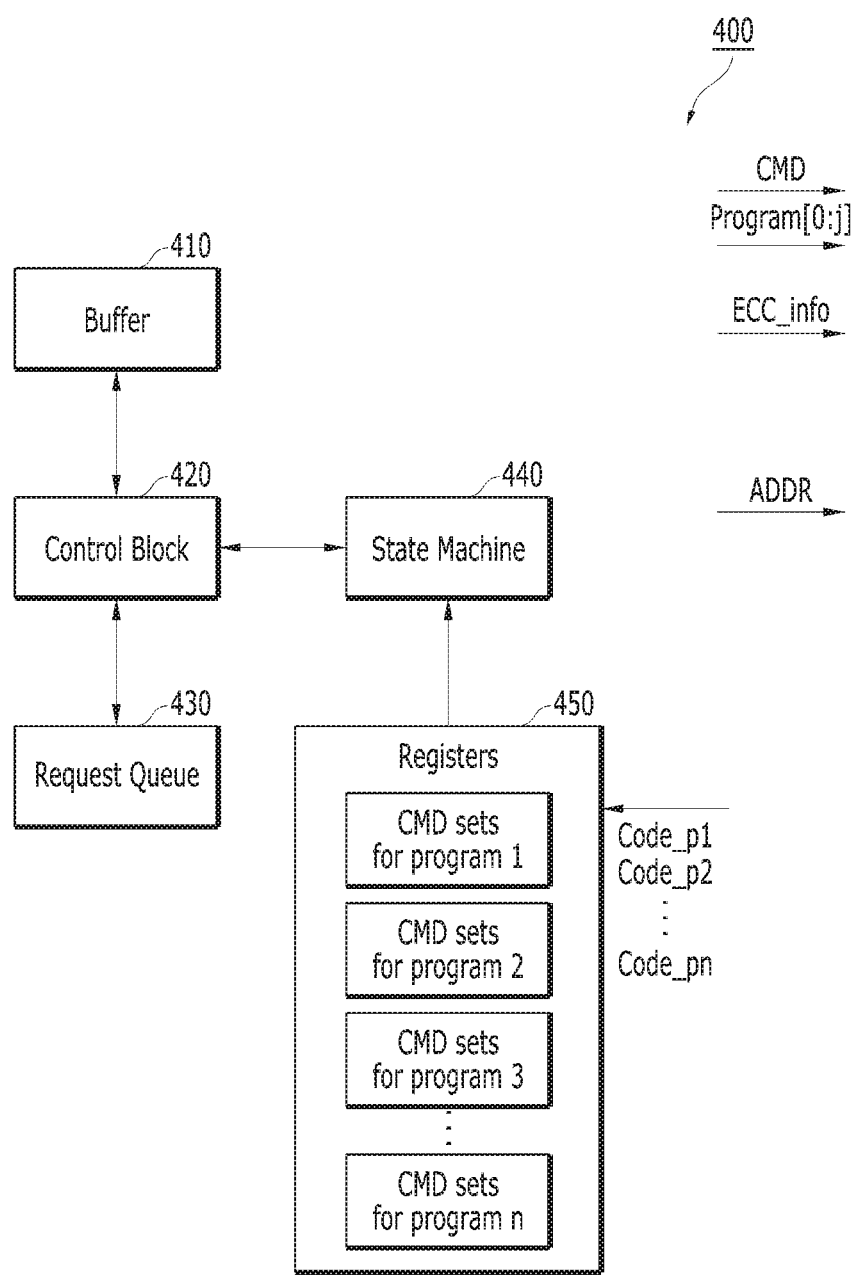
FIG. 8 is a block diagram illustrating a first control unit in accordance with the embodiment of the present invention.

FIG. 8 is a block diagram illustrating the first control unit 400 in accordance with the embodiment of the present invention.

Referring to FIG. 8, the first control unit 400 may include a buffer 410, a control block 420, a request queue 430, a state machine 440, and registers 450. The buffer 410 may store data to be stored in the memory device 200 which are received from an external device (e.g., the host 20) or data received from the memory device 200. The data stored in the buffer 410 may also be transferred to the external device (e.g., the host 20). The request queue 430 may receive and store the ECC information ECC_info from the memory device 200. Also, the request queue 430 may receive, and store, the command CMD and the address ADDR from the outside (e.g., the host 20).

The control block 420 may receive information Code_p1, Code_p2, . . . , Code_pn for selecting an optimal command set for each program from the second control unit 500 and store the received information in the registers 450. The registers 450 may include a register for storing information Code_p1 for selecting an optimal command set for a program 1, a register for storing information Code_p2 for selecting an optimal command set for a program 2, a register for storing information Code_p3 for selecting an optimal command set for a program 3, and a register for storing information Code_pm for selecting an optimal command set for a program m.

The control block 420 may detect an optimal command set among the command sets for the specific program stored in the registers 450 when the specific program is executed for the memory device 200 and control a program operation to be performed through the corresponding command set. The state machine 440 may control the state of the specific program performed on the memory device 200 under the control of the control block 420.

Referring back to FIGS. 4, 5, 7 and 8, the second control unit 500 may receive the command CMD, the program (or the combination of n command sets), ECC_info (or ECC correction information) from the first control unit 400, and an address ADDR. The registers 450 included in the first control unit 400 may include register sets for n programs, respectively. The respective registers for the programs may store all possible combinations of command sets for each rank. Once the operation is completed by the computation network 300, the command set selection codes Code_p1 to Code_pn may be generated by the second control unit 500. The generated command set selection codes Code_p1 to Code_pn may be inputted to the first control unit 400. Each code may be inputted to the corresponding register set, and the optimal command set may be selected for each program. That is, each of the computation units 300A of the computation network 300 may continuously accumulate and learn the command information executed by the DRAM 200 and the ECC correction information generated in the DRAM rank, and periodically output the codes Code_p1 to Code_pn for selecting the optimal command set.

First, when the program is executed, the command counter 510 in the second control unit 500 may count the total number CC_1 to CC_m of commands executed for each rank and store them in the registers 520. Also, the ECC counter 550 in the second control unit 500 may store the number of ECC corrections for each rank ECC_1 to ECC_m occurring in each rank in the registers 530. The averaging logic 580 may compute the average of all the command sets processed while all the m ranks execute the n programs {CC_AVG=(number of command sets processed while the m ranks execute the n programs/(m×n)} and the average number of commands (CC1_AVG to CCm_AVG) processed when each rank executes the n programs, to thereby store the result in the internal registers. In case of CC1_AVG, it is a value obtained by dividing a sum of all the command sets executed while the rank 1 executes n programs by n. CC_AVG and (CC1_AVG to CCm_AVG) transferred to the computation units 300A of the computation network 300 are values stored in the registers while executing n programs in the preceding cycle (or time section) and transferred when the program is executed in the next cycle. The decoder 570 may receive the program information Program[0:j] and generate enable signals EN1 to ENn when the particular program is selected and transfer the generated enable signals to the computation units 300A of the computation network 300. The total number of commands for each rank CC_1 to CC_m executed for each program and the total number ECC_1 to ECC_m of ECC corrections counted for each program may also be transferred to the computation units 300A of the computation network 300.

The computation network 300 may receive the information transferred from the second control unit 500 and perform a computation operation by the (m×n) computation units 300A. Also, the computation network 300 may generate command set selection signals W1_p1 to Wm_pn according to the result of the operation and output the generated command set signals W1_p1 to Wm_pn to the second control unit 500. The corresponding command set selection signals W1_p1 to Wm_pn may be transferred to the first control unit 400 as codes Code_p1 to Code_pn for generating the optimal command set through the second control unit 500. Then, the first control unit 400 may select the optimal command set corresponding to the received codes Code_p1 to Code_pn. The first control unit 400 may perform a program operation including the selected command set.

Figure 9:
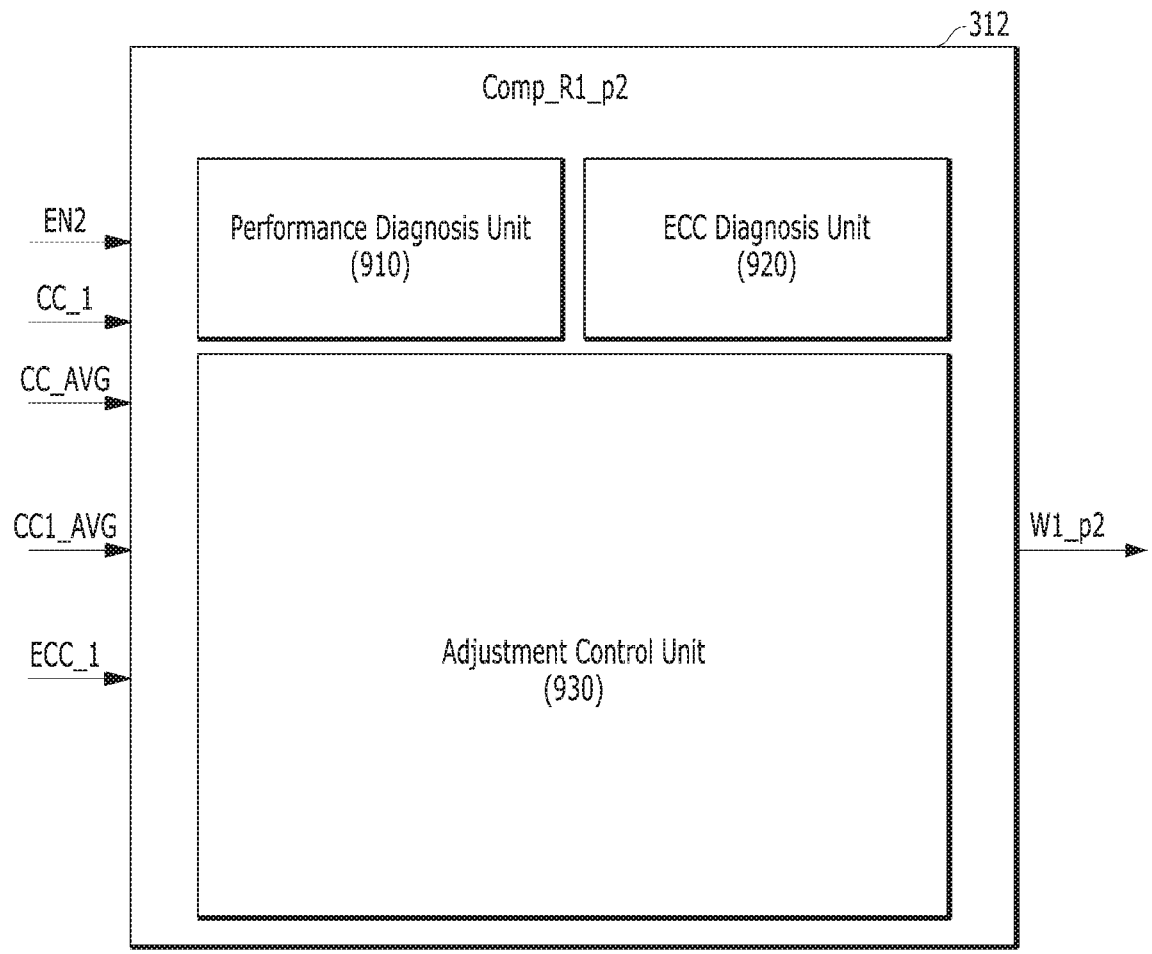
FIG. 9 is a block diagram illustrating a unit computation unit in accordance with the embodiment of the present invention.

FIG. 9 is a block diagram illustrating the unit computation unit 312 in accordance with the embodiment of the disclosure. Although FIG. 9 exemplarily illustrates the structure of a unit computation unit Comp_R1_p2 312 for the rank 1 and the program 2 among a plurality of unit computation units included in the computation network 300, it is obvious to those skilled in the art that the other remaining unit computation units may also be formed and operate similarly.

Referring to FIG. 9, the unit computation unit 312 may include a performance diagnosis unit 910, an ECC diagnosis unit 920, and an adjustment control unit 930. The performance diagnosis unit 910 may analyze the performance degradation. The ECC diagnosis unit 920 may measure the ECC correction level to determine the risk of an ECC uncorrectable error. The adjustment controller 930 may learn the past stored data based on the extent of corresponding performance degradation and the current number of ECC corrections and output a command set selection signal or code W1_p2 that may guarantee optimal performance, system life span, and system reliability. The unit computation unit 312 may receive the values EN2, CC_1, CC_AVG, CC1_AVG, ECC_1 from the second control unit 500, and may transfer the command set selection signal or code W1_p2 to the second control unit 500.

Figure 10:
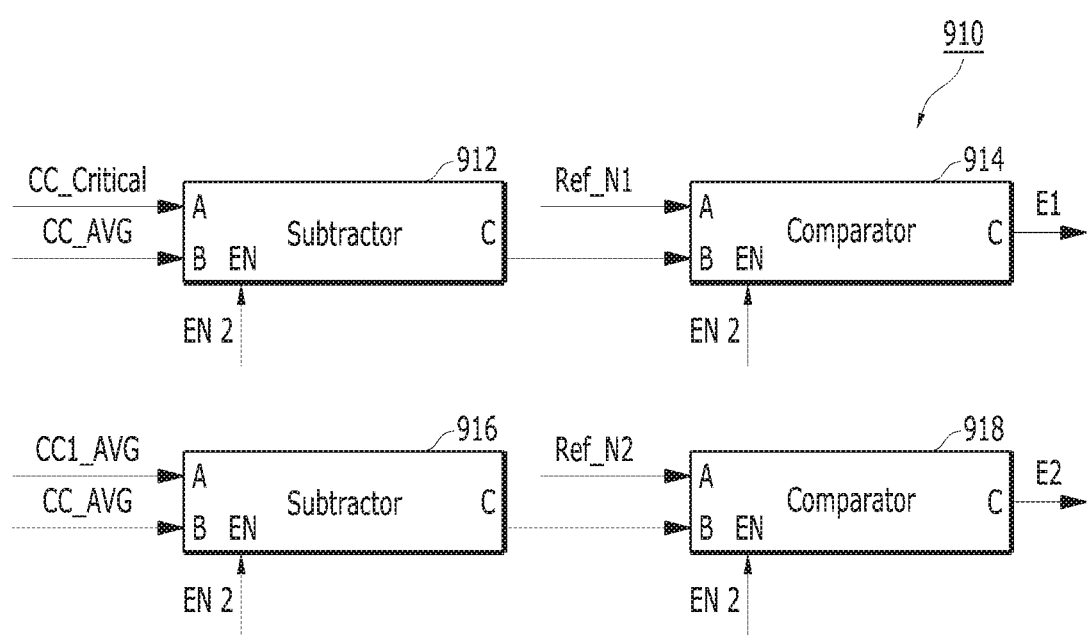
FIG. 10 is a block diagram illustrating a performance diagnosis unit in accordance with the embodiment of the present invention.

FIG. 10 is a block diagram illustrating a performance diagnosis unit in accordance with the embodiment of the disclosure.

Referring to FIG. 10, the performance diagnosis unit 910 may include subtractors 912, 916, and comparators 914, 918. The subtractors 912, 916 and the comparators 914, 918 may be enabled in response to the value EN2. The subtractor 912 may receive the values CC_Critical and CC_AVG, perform a subtraction operation onto the received signals, and output a subtraction result to the comparator 914. The comparator 914 may compare the subtraction result received from the subtractor 912 with the reference value Ref_N1, and output a comparison result E1. The subtractor 916 may receive the values CC1_AVG and CC_AVG, perform a subtraction operation onto the received signals, and output a subtraction result to the comparator 918. The comparator 918 may be compare the subtraction result received from the subtractor 916 with the reference value Ref_N2, and output a comparison result E2.

This performance diagnosis unit 910 may perform two operations and generate and output the signals E1, E2 according to the execution results. First, when the difference (CC_Critical−CC_AVG) between the value CC_AVG representing the total throughput of all the ranks processing the n programs and the value CC_Critical stored in advance is greater than the reference value Ref_N1, the performance diagnosis unit 910 may decide overall performance drop and generate the signal E1 of a logic high level 'H'. Secondly, when the difference (CC_AVG−CC1_AVG) between the average variable CC1_AVG representing the throughput of the command set of a corresponding rank and the average variable CC_AVG representing the throughput of the command sets of the entire ranks is greater than the reference value Ref_N2, the performance diagnosis unit 920 may generate the signal E2 of a logic high level 'H'.

Figure 11:
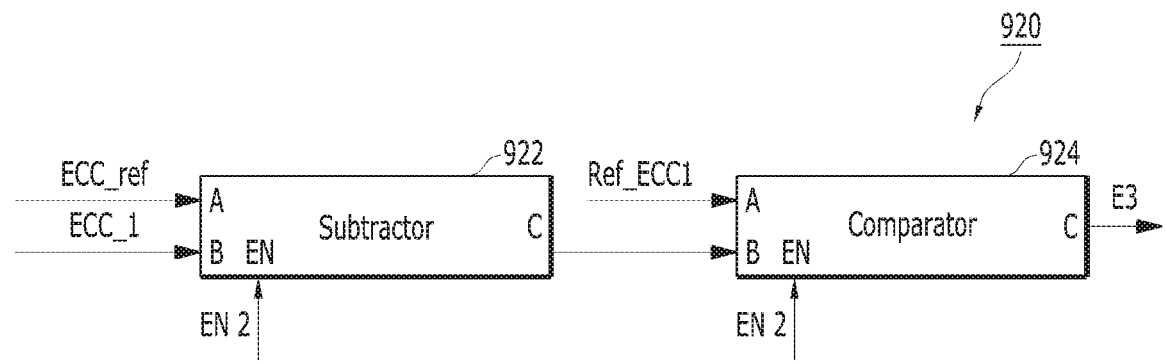
FIG. 11 is a block diagram illustrating an Error Correction Code (ECC) diagnosis unit in accordance with the embodiment of the present invention.

FIG. 11 is a block diagram illustrating the Error Correction Code (ECC) diagnosis unit 920 in accordance with the embodiment of the present invention.

Referring to FIG. 11, the ECC diagnosis unit 920 may include a subtractor 922 and a comparator 924. The subtractor 922 and the comparator 924 may be enabled in response to the value EN2. The subtractor 922 may receive a cumulative count number ECC_1 and a reference value ECC_ref, perform a subtraction operation onto the received signals, and output a subtraction result to the comparator 924. The comparator 924 may compare the subtraction result received from the subtractor 922 with a reference value Ref_ECC1, and output a comparison result E3.

When the difference (ECC_ref−ECC_1) between the cumulative count number ECC_1 of the number of ECC corrections occurring in the rank 1 and the reference value ECC_ref is smaller than the reference value Ref_ECC1, the ECC diagnosis unit 920 may decide that the number of real-time memory cell failure of the rank 1 is increased much and generate the signal E3 of a logic high level 'H'.

Figure 12:
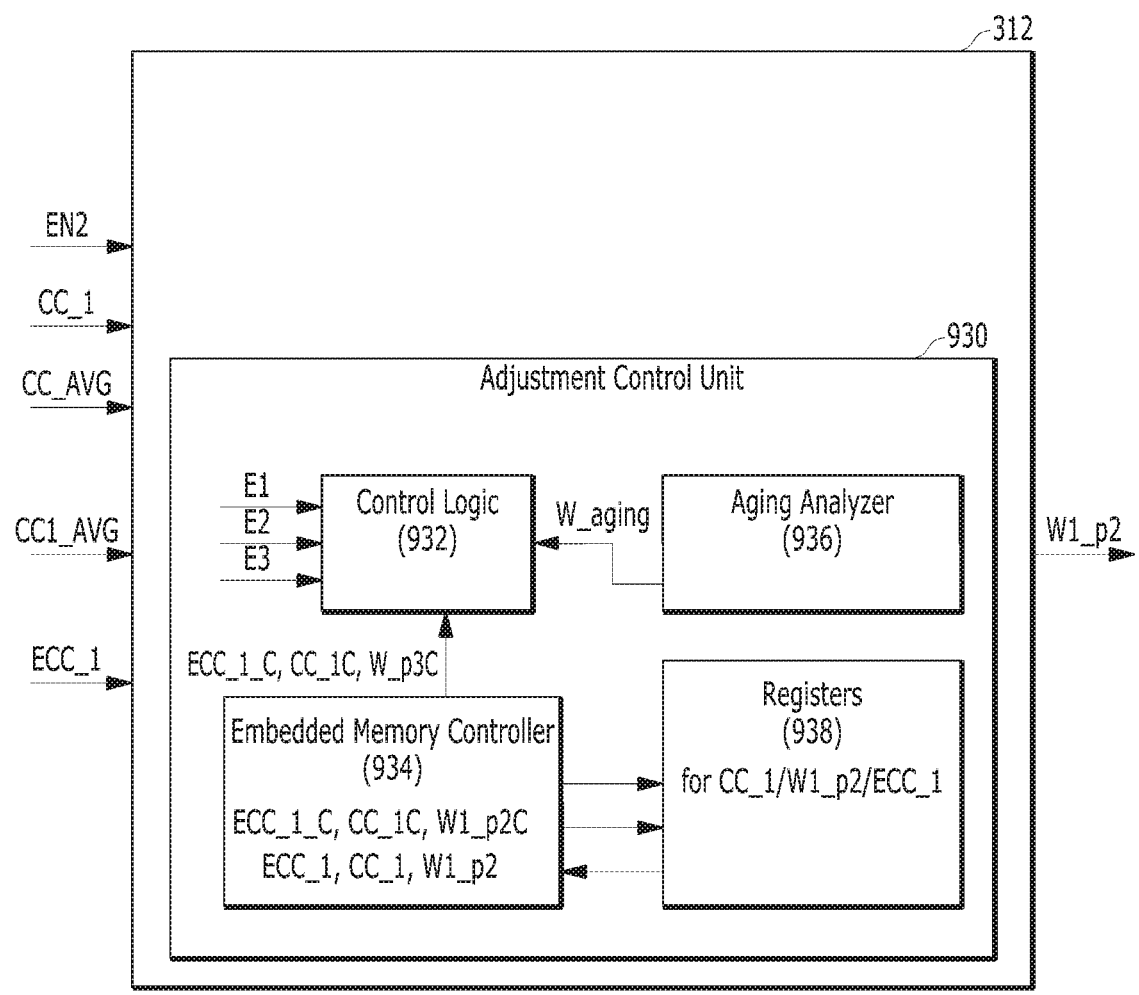
FIG. 12 is a block diagram illustrating an adjustment control unit in accordance with the embodiment of the present invention.

FIG. 12 is a block diagram illustrating the adjustment control unit 930 in accordance with the embodiment of the disclosure.

Referring to FIG. 12, the adjustment control unit 930 may include control logic 932, an embedded memory controller 934, an aging analyzer 936, and registers 938. The control logic 932 of the adjustment control unit 930, i.e., the adjustment control unit 930, may be executed by the signals E1, E2 and E3 of a logic high level 'H'. The registers 938 may perform a function of accumulating the past information on the rank 1, such as the past command processing number CC_1 of the rank 1, corresponding command set selection code W1_p2, and the number ECC_1 of ECC corrections, in a look-up table. The registers 938 may be formed of a Static Random-Access Memory (SRAM) or a flip-flop.

Figure 13:
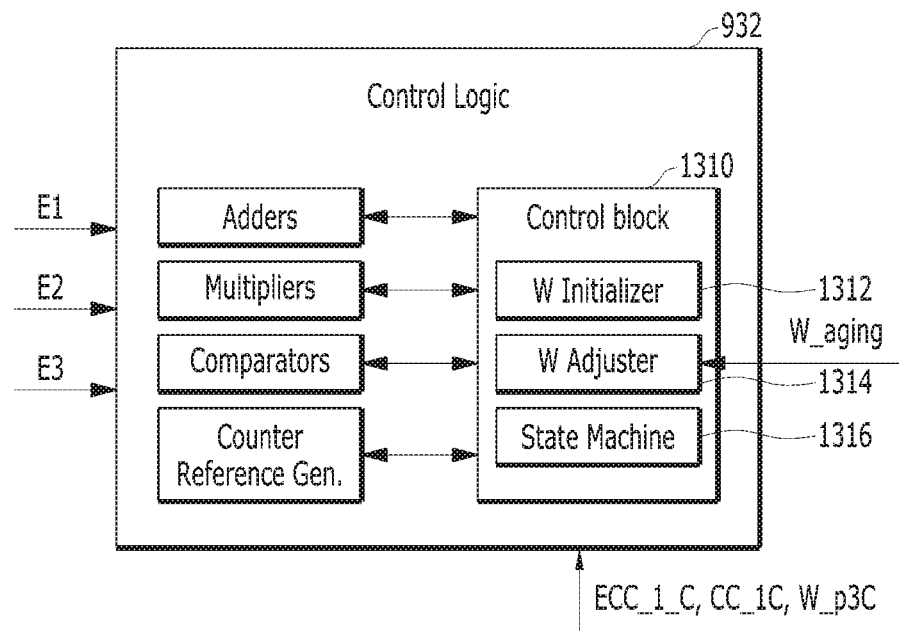
FIG. 13 is a block diagram illustrating a control logic in accordance with the embodiment of the present invention.

FIG. 13 is a block diagram illustrating the control logic 932 in accordance with the embodiment of the present invention.

Referring to FIG. 13, the control logic 932 may perform a function of predicting a final command set selection signal or a code value W1_p2 for performing a corresponding program (e.g., the program 3) of a corresponding rank (e.g., the rank 1). The control logic 932 may be performed by the signals E1, E2, and E3 of the logic high level 'H' and select the optimum command set selection signal or the code value W1_p2 by searching and analyzing a sequence of information CC_1/W1_p2/ECC_1 that are read from the look-up table of the registers 938 through the embedded memory controller 934. For this operation, the control logic 932 may include a control block 1310, adders, multipliers, comparators, and a counter/reference generator.

Also, the control block 1310 may perform a function of initializing or adjusting the optimum command set selection code value W1_p2. For this operation, the control block 1310 may include a code (W) initializer 1312, a W adjuster 1314, and a state machine 1316. The control block 1310 may not perform the operation of changing the command set selection code value according to a signal W_aging transferred from the aging analyzer 936. For example, when the signal W_aging transferred from the aging analyzer 936 indicates a high probability of aging faults rather than intermittent faults, the control block 1310 may not perform an operation of initializing or adjusting the command set selection code value.

Figure 14:
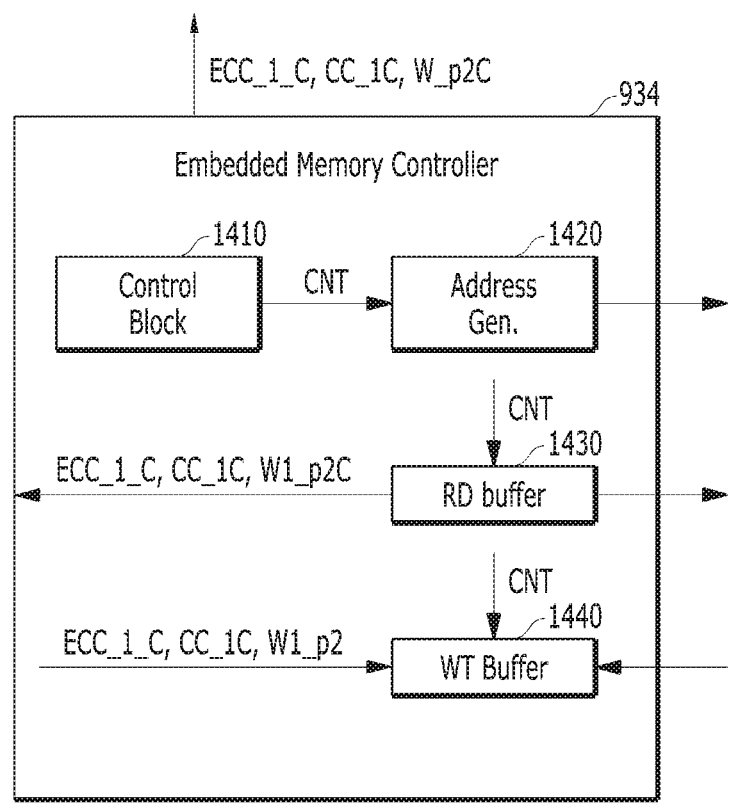
FIG. 14 is a block diagram illustrating an embedded memory controller in accordance with the embodiment of the present invention.

FIG. 14 is a block diagram illustrating an embedded memory controller 934 in accordance with the embodiment of the present invention.

Referring to FIG. 14, the embedded memory controller 934 may perform a function of writing current information on a corresponding rank and a corresponding program in the registers 938 and reading past information on the corresponding rank and the corresponding program written in the registers 938. The memory controller 934 for this operation may include a control block 1410, an address generator 1420, a read buffer 1430, and a write buffer 1440. The address generator 1420 may generate the address ADDR in response to a signal CNT generated by the control block 1410. The read buffer 1430 may read and buffer the information ECC_1C, CC_1C, W1_p2C on the corresponding rank and the corresponding program written in a particular area of the registers 938 which corresponds to the address ADDR in response to the signal CNT generated by the control block 1410. The write buffer 1440 may buffer the information ECC_1C, CC_1C, W1_p2C on the corresponding rank and the corresponding program to be written in the particular area of the registers 938 corresponding to the address ADDR in response to the signal CNT generated by the control block 1410. Information to be buffered in the write buffer 1440 may be received from the control logic 932, and information buffered in the read buffer 1430 may be transferred to the control logic 932 or the aging analyzer 936.

Figure 15:
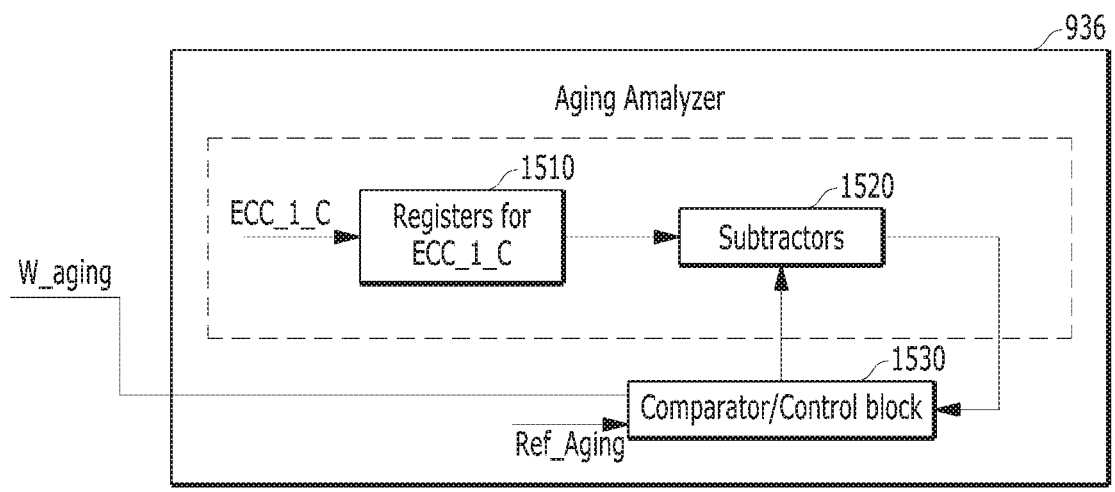
FIG. 15 is a block diagram illustrating an aging analyzer in accordance with the embodiment of the present invention.

FIG. 15 is a block diagram illustrating the aging analyzer 936 in accordance with the embodiment of the present invention.

Referring to FIG. 15, the aging analyzer 936 may analyze the trend of an increase amount of past ECC correction information ECC_1_C for each period (or time section) that is read from the registers 938 and decide the extent that aging occurs in the corresponding rank. If an offset value converted from the extent that aging occurs in the rank is greater than a reference value Ref_Aging, the aging analyzer 936 may decide that the cause for the excessive increase in the ECC correction decided by the ECC diagnosis unit 920 is more likely to be aging faults than intermittent faults. The aging analyzer 936 may control the control logic 932 not to change the kind of the command set.

To this end, the aging analyzer 936 may include registers 1510, subtractors 1520, and a comparator/control block 1530. The registers 1510 may store past ECC correction information ECC_1_C that is read from the registers 938. The subtractors 1520 may output a value according to the increase amount of the ECC correction information ECC_1_C for each cycle by performing a subtraction operation onto the past ECC correction information ECC_1_C per each cycle. The comparator/control block 1530 may compare the value according to the increase amount of the ECC correction information ECC_1_C for each cycle with the predetermined reference value Ref_Aging to generate a W_aging signal according to the comparison result. For example, when the value according to the increase amount of the ECC correction information ECC_1_C for each cycle is greater than the reference value Ref_Aging, the aging analyzer 936 may decide that the cause of the excessive increase amount of the ECC correction determined by the ECC diagnosis unit 920 is more likely to be aging faults than intermittent faults. The control logic 932 may generate the W_aging signal for not changing the kind of the command set.

Figure 16:
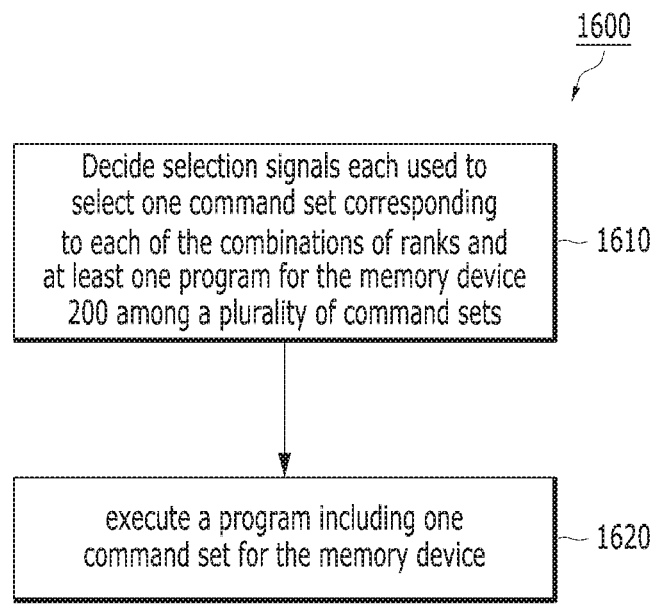
FIG. 16 is a flowchart describing an operation of performing an operation onto a memory device in accordance with the embodiment of the present invention.

FIG. 16 is a flowchart describing an operation of performing an operation onto a memory device in accordance with the embodiment of the disclosure. The operation shown in FIG. 16 may be performed as the memory controller 100 including the control unit 100A and the computation network 300 controls the memory device 200 including a plurality of ranks as shown in FIGS. 2 to 15.

Referring to FIG. 16, the memory controller 100 may perform an operation 1610 of deciding selection signals, each of which is used to select one command set corresponding to each of the combinations of the ranks and the at least one program performed for the memory device 200 among a plurality of command sets.

The memory controller 100 may then perform an operation 1620 on the memory device 200 to execute a program including one command set among the command sets.

According to an embodiment of the present invention, the operation 1610 may include diagnosing performance at each of the ranks when the program is executed and deciding the selection signals based on the performance diagnosis result in each of the computation units that respectively correspond to the ranks.

According to an embodiment of the present invention, the operation 1620 may include the control unit controlling the program to be performed onto the ranks in response to the selection signals.

According to an embodiment of the present invention, the step of controlling may include accumulating the number of ECC error corrections and commands executed in the memory device regarding the program, and providing each of the computation units with the accumulation results.

According to an embodiment of the present invention, the operation 1610 may include diagnosing performance drop resulting from the execution of the program in the corresponding rank among the ranks based on the accumulation result for each of the computation units.

According to an embodiment of the present invention, the operation 1610 may include diagnosing an ECC error rate according to the execution of the program in the corresponding rank based on the accumulation result in each of the plurality of computation units.

According to an embodiment of the present invention, the operation 1610 may include deciding a selection signal for selecting a command set that increases the number of commands executed in the corresponding rank, when a performance drop resulting from the execution of the program is diagnosed in the ranks.

According to an embodiment of the present invention, the operation 1610 may include deciding a selection signal for selecting a command set that increases the number of commands executed in the corresponding rank, when a performance drop resulting from the execution of the program is diagnosed in the corresponding rank.

According to an embodiment of the present invention, the operation 1610 may include deciding a selection signal for selecting a command set that reduces the ECC error rate, when the ECC error rate is diagnosed to exceed a predetermined range.

According to an embodiment of the present invention, the operation 1610 may further include analyzing an increase amount of the ECC error rate for each cycle. When the increase amount of the ECC error rate is analyzed to be greater than a predetermined reference value, the operation 1610 may not perform the operation of deciding the selection signal for selecting a new command set.

According to an embodiment of the present invention, the operation 1610 may further include deciding a selection signal for selecting a command set that may reduce the ECC error rate while not significantly reducing the number of commands executed in the corresponding rank, when the increase amount of the ECC error rate is analyzed to be smaller than the reference value.

FIGS. 17A to 17D are flowcharts describing an operation 1710, 1720, 1730, 1740 of selecting a command set for performing a program operation onto a memory device that is performed by the memory controller in accordance with the embodiment of the present invention. The operation shown in FIGS. 17A to 17D may be performed as the memory controller 100 including the control unit 100A and the computation network 300 controls the memory device 200 including the ranks as shown in FIGS. 2 to 15.

Figure 17A:
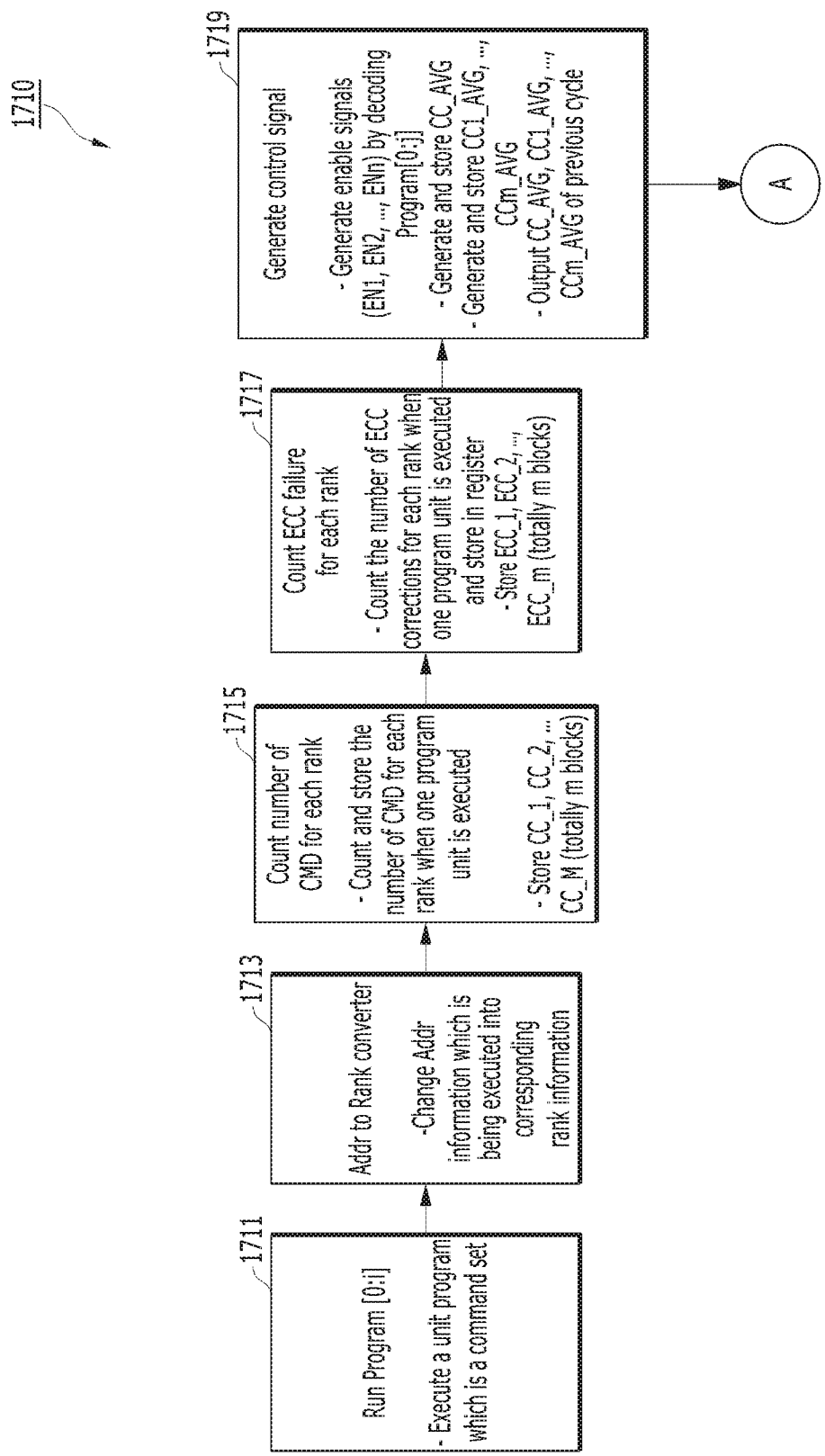
FIGS. 17A to 17D are flowcharts describing an operation of selecting a command set for performing a program operation onto a memory device that is performed by the memory controller in accordance with the embodiment of the present invention.

Referring to FIG. 17A, the step 1710 may include steps 1711, 1713, 1715, 1717, 1719 that may be performed by the first control unit 400 and the second control unit 500. The first control unit 400 may execute programs each of which is a command set in step 1711. When it is decided that one cycle in which n programs have been all executed ends, the second control unit 500 may convert the running address information into corresponding rank information in step 1713, count the number of commands for each rank CC_1, CC_2, . . . , CC_m and the number of ECC correctors ECC_1, ECC_2, . . . , ECC_m by using the counters 510, 550, and store the count results in the registers 520, 530, respectively in steps 1715, 1717.

Also, the second control unit 500 may generate and store various control signals EN1, EN2, . . . , ENm, CC_AVG, CC1_AVG, CC2_AVG, . . . , CCm_AVG through additional operations on the above information in step 1719. In case of the rank 1 and the program 2, the second control unit 500 may store the related control signals EN2, CC_AVG, CC1_AVG. When the next cycle is repeated, the second control unit 500 may transfer the values CC_AVG, CC1_AVG that are stored in the previous cycle to the computation network 300.

Figure 17B:
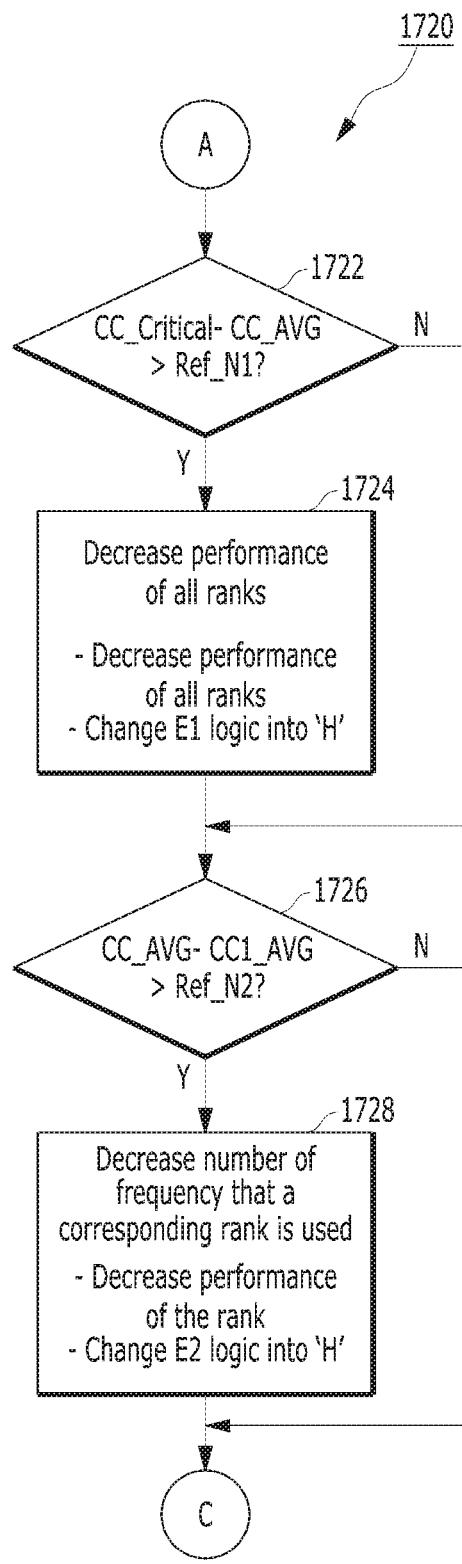

Referring to FIG. 17B, the step 1720 may include steps 1722, 1724, 1726, 1728, which may be performed by the performance diagnosis unit 910 of the computation unit 312 included in the computation network 300. One example of the operation performed by the computation unit 312 will now be described, but it should be noted that the other remaining computation units may perform the same or similar operations. Whenever each program is executed, each of the m×n computation units 300A may learn accumulated data and output an optimal command selection code.

When the performance diagnosis unit 910 decides whether a condition (CC_Critical-CC_AVG)>Ref_N1 would be satisfied in step 1722, the performance diagnosis unit 910 may decide that the overall performance is decreased and change the logic level of the signal E1 to a logic high level 'H' in step 1724. Also, when the performance diagnosis unit 910 decides a calculated value (CC_AVG-CC1_AVG) in step 1726, the performance diagnosis unit 910 may decide that the number of frequency that the rank is used is lower than those of the other ranks and change the logic level of the signal E2 to a logic high level 'H' in step 1728.

Figure 17C:
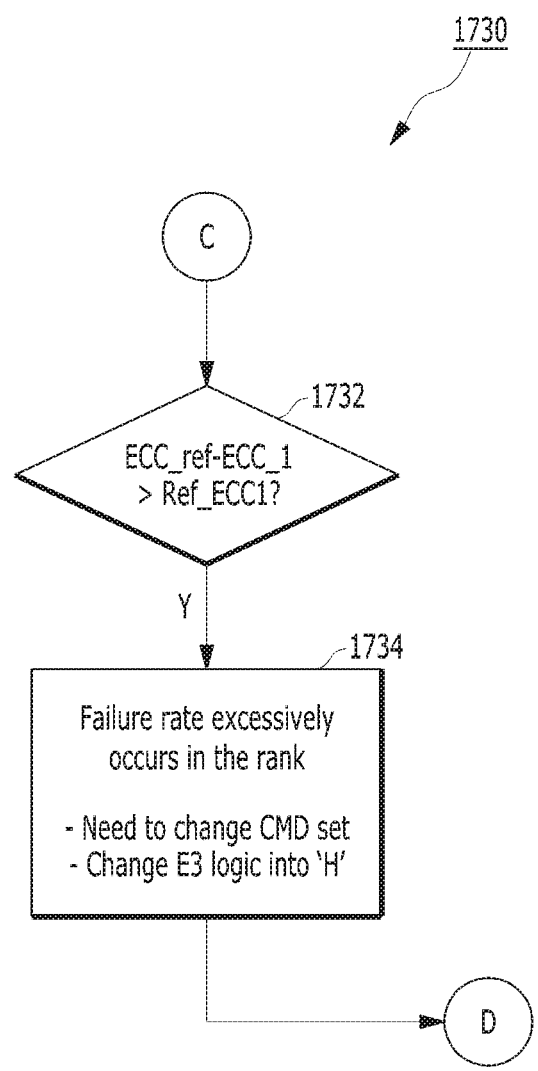

Referring to FIG. 17C, the step 1730 may include steps 1732, 1734 that may be performed by the ECC diagnosis unit 920 of the computation unit 312 included in the computation network 300. One example of the operation performed by the computation unit 312 will now be described, but it should be noted that other remaining computation units may also perform the same or similar operations. Whenever each program is executed, each of the m×n computation units 300A may learn accumulated data and output an optimal command selection code.

When the ECC diagnosis unit 920 decides a case of (ECC_ref-ECC_1)<Ref_ECC1 in step 1732, it is decided that the error rate excessively occurs in the corresponding rank and the command set needs to be changed, and the logic level of the signal E3 may be changed to a logic high level 'H' in step 1734.

Figure 17D:
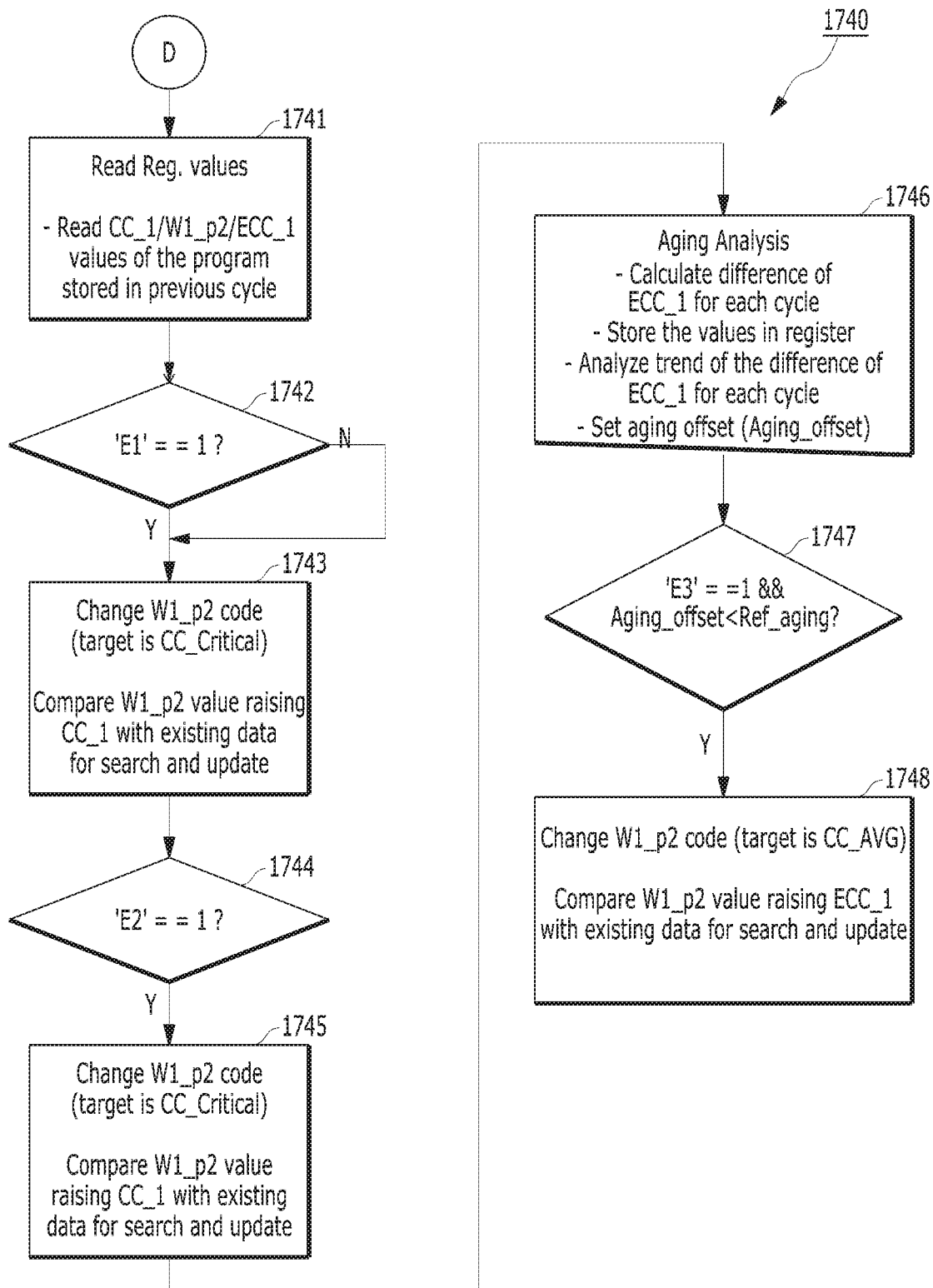

Referring to FIG. 17D, the step 1740 may include steps 1741, 1742, 1743, 1744, 1745, 1746, 1747, 1748, which may be performed by the adjustment control unit 930 of the computation unit 312 included in the computation network 300. Herein, one example of the operation performed by the computation unit 312 is described, but it should be noted that the other remaining computation units may also perform the same or similar operations. In short, whenever each program is executed, each of the m×n computation units 300A may learn accumulated data and output an optimal command selection code.

The adjustment control unit 930 may read the values CC_1, W1_$p$2, ECC_1 stored in the look-up table of the internal registers 938 in the previous cycle in step 1741. When it is determined that the signal E1 or the signal E2 is at a logic high level 'H' or a '1' level in steps 1742, 1744, the adjustment control unit 930 may upwardly adjust the CC1 for the corresponding rank and the program, which is the total sum of the command sets processed by the rank 1 in steps 1743, 1745. In other words, the adjustment control unit 930 may search for a value of W1_$p$2 code that raises the CC_1 within a range that does not significantly increase the ECC_1 in the past look-up table, when the corresponding change command set selection code W1_$p$2 is predicted. The adjustment control unit 930 may set the value as the optimal code value W1_$p$2.

When it is determined that the signal E3 is at a logic high level 'H' or a '1' level, the adjustment control unit 930 may determine that the currently accumulated number of ECC corrections ECC_1 is so high that the command set is likely to be changed. In this case, the adjustment control unit 930 may perform an aging analysis first in step 1746.

The adjustment control unit 930 may load the ECC_1 information for each cycle in the internal registers 938 and analyze the increase amount of the accumulated ECC_1 counts per cycle. When the rate of the increase amount increases continuously as time passes, the adjustment control unit 930 may determine that there are aging faults in the corresponding rank. The adjustment control unit 930 may convert the increase amount into an Aging_offset value in the step 1746. When it is determined that the extent of the Aging_offset is so large that it is greater than a predetermined reference value Ref_aging, the adjustment control unit 930 may determine that a corresponding ECC correction fault is more likely to be an again fault than the intermittent fault and does not change the command set.

When it is determined that the signal E3 is at a logic high level 'H' or a '1' level and the Aging_offset value is smaller than the reference value Ref_aging, the adjustment control unit 930 may determine that the increase amount of the fault originates from an intermittent fault and the adjustment control unit 930 may change the command set. In other words, adjustment control unit 930 may search and set the code value W1_$p$2 that does not significantly lower the CC_1 while decreasing the ECC_1 through the past look-up table analysis.

When the operations of FIGS. 17A to 17D described above are repeatedly performed by m×n computation units corresponding to all the ranks and all programs for several cycles, it is possible to detect an optimal command set selection code in terms of performance, system life span, and the number of ECC uncorrectable errors.

According to the embodiments of the present invention, the memory scheduling method may maximize the lifespan and performance of a system by uniformly using DRAM ranks while minimizing an ECC-uncorrectable error rate that may additionally occur in an actual usage environment of a memory device at the same time.

Also, according to the embodiments of the present invention, the memory scheduling method may minimize performance penalty by continuously accumulating ECC correction information in an internal computation unit, and by learning the tendency, detecting whether a fault is an aging fault or an intermittent fault. When an increase in the number of ECC correction signifies an aging fault, the memory scheduling method may not manipulate a command set.

Also, according to the embodiments of the present invention, the memory scheduling method may require a minimal computation time through a parallel processing by designing a total of (m×n) computation units in parallel for m ranks and n programs and predicting a memory scheduling operation in each of the computation units.

Also, according to the embodiments of the present invention, the memory scheduling method may accumulate past data in each of the computation units and adopt an artificial intelligence parallel processing scheme for predicting future data. The future data may be predicted by learning corresponding past data with a quite high accuracy in data prediction.

While the present invention has been described with respect to specific embodiments, it will be apparent to those skilled in the art that various changes and modifications may be made without departing from the spirit and scope of the invention as defined in the following claims.

What is claimed is:

1. A method for operating a memory controller for controlling an operation of a memory device including m ranks, where m is an integer greater than 0, comprising:
    performing an Error Correction Code (ECC) operation onto a data stored in, or outputted from, at least one rank of the memory device;
    deciding selection signals, each of which selects one command set among a plurality of command sets, according to combinations of the m ranks and n programs, where n is an integer greater than 0, executed in the memory device; and
    executing a program including the selected command set in the memory device to cure an ECC uncorrectable error while the ECC operation is performed,
    wherein the deciding of the selection signals includes:
    diagnosing performance of each of the m ranks when each of the n programs is executed, to produce a diagnosis result in m×n computation circuits corresponding to the m ranks and the n programs, and deciding the selection signals based on the diagnosis result; and
    controlling the programs to be executed for the ranks in a control circuit in response to the selection signals,
    wherein the m×n computation circuits include an independent computation circuit for each of the n programs, and
    wherein the m×n computation circuits include different computation circuits for each of the m ranks.

2. The method of claim 1, wherein the controlling of the programs to be executed for the m ranks includes:
    accumulating a number of Error Correction Code (ECC) error corrections and commands executed in the memory device in relation to the n programs, to produce an accumulation result, and providing each of the m×n computation circuits with the accumulation result.

3. The method of claim 2, wherein the deciding of the selection signals includes:
    diagnosing a performance drop resulting from the execution of each program in a corresponding rank among the m ranks based on the accumulation result in each of the m×n computation circuits.

4. The method of claim 3, wherein the deciding of the selection signals further includes:
    when the performance drop according to the execution of each of the n programs is diagnosed in the m ranks,
    deciding a selection signal for selecting a command set that increases a number of commands executed in the corresponding rank.

5. The method of claim 3, wherein the deciding of the selection signals further includes:
    when the performance drop according to the execution of each program is diagnosed in the corresponding rank,
    deciding a selection signal for selecting a command set that increases a number of commands executed in the corresponding rank.

6. The method of claim 2, wherein the deciding of the selection signals includes:
    diagnosing an ECC error rate according to the execution of each program in the corresponding rank based on the accumulation result in each of the m×n computation circuits.

7. The method of claim 6, wherein the deciding of the selection signals further includes:
    when the ECC error rate is diagnosed to exceed a predetermined range,
    deciding a selection signal for selecting a command set that decreases the ECC error rate.

8. The method of claim 6, wherein the deciding of the selection signals further includes:
    when an increase amount of the ECC error rate is analyzed to be greater than a predetermined reference value,
    not performing an operation of deciding a selection signal for selecting a new command set.

9. The method of claim 8, wherein the deciding of the selection signals further includes:
    when the increase amount of the ECC error rate is analyzed to be less than the predetermined reference value,
    deciding a selection signal for selecting a command set that does not decrease a number of commands executed in the corresponding rank while decreasing the ECC error rate.

10. A memory system, comprising:
    a memory device that includes m ranks, where m is an integer greater than 0; and
    a memory controller suitable for:
    deciding selection signals, each of the selection signals selecting one command set among a plurality of command sets, according to combinations of the m ranks and n programs, where n is an integer greater than 0, executed in the memory device, and executing a program including the selected command set in the memory device,
    wherein the memory controller includes:
    m×n computation circuits corresponding to the combinations of them ranks and then programs, suitable for diagnosing performance of each of the m ranks when each of the n programs is executed, to produce a diagnosis result, and deciding the selection signals based on the diagnosis result; and
    a control circuit coupled between the m×n computation circuits and the memory device, suitable for controlling the programs to be executed for the m ranks in response to the selection signals,
    wherein the m×n computation circuits include an independent computation circuit for each of the n programs, and
    wherein the m×n computation circuits include different computation circuits for each of the m ranks.

11. The memory system of claim 10, wherein the control circuit accumulates a number of Error Correction Code (ECC) error corrections and commands executed in the memory device in relation to the n programs, to produce an accumulation result, and provides each of the m×n computation circuits with the accumulation result.

12. The memory system of claim 11, wherein each of the m×n computation circuits includes:
a performance diagnosis circuit suitable for diagnosing a performance drop resulting from the execution of each program in a corresponding rank among the m ranks based on the accumulation result provided from the control circuit.

13. The memory system of claim 12, wherein when the performance diagnosis circuit diagnoses the performance drop according to the execution of each program in the m ranks,
each of the m×n computation circuits decides a selection signal for selecting a command set that increases a number of commands executed in the corresponding rank.

14. The memory system of claim 12, wherein when the performance diagnosis circuit diagnoses the performance drop according to the execution of each program in the corresponding rank,
each of the m×n computation circuits decides a selection signal for selecting a command set that increases a number of commands executed in the corresponding rank.

15. The memory system of claim 11, wherein each of the m×n computation circuits includes:
an ECC diagnosis circuit suitable for diagnosing an ECC error rate according to the execution of each program in the corresponding rank based on the accumulation result provided by the control circuit.

16. The memory system of claim 15, wherein when the ECC diagnosis circuit diagnoses that the ECC error rate exceeds a predetermined range,
each of the m×n computation circuits decides a selection signal for selecting a command set that decreases the ECC error rate.

17. The memory system of claim 15, wherein when an increase amount of the ECC error rate is analyzed to be greater than a predetermined reference value,
each of the m×n computation circuits does not perform an operation of deciding a selection signal for selecting a new command set.

18. The memory system of claim 15, wherein when an increase amount of the ECC error rate is analyzed to be less than a predetermined reference value,
each of the m×n computation circuits decides a selection signal for selecting a command set that does not decrease a number of commands executed in the corresponding rank while decreasing the ECC error rate.

19. A memory system, comprising:
a memory device including m ranks, where m is an integer greater than 0; and
a memory controller, electrically coupled to the memory device, suitable for curing an ECC uncorrectable error while an ECC operation is performed,
wherein the memory controller determines selection signals, each of the selection signals for selecting a single command set among a plurality of command sets, according to at least one of various combinations regarding the m ranks and n programs, where n is an integer greater than 0, executed in the memory device, to provide the single command set into the memory device,
wherein the memory controller includes:
m×n computation circuits corresponding to combinations of the m ranks and the n programs, suitable for diagnosing performance of each of the ranks when each program is executed, to produce a diagnosis result, and deciding the selection signals based on the diagnosis result; and
a control circuit coupled between the m×n computation circuits and the memory device, suitable for controlling the programs to be executed for the ranks in response to the selection signals,
wherein the m×n computation circuits include an independent computation circuit for each of the n programs, and
wherein the m×n computation circuits include different computation circuits for each of the m ranks.

* * * * *